(12) United States Patent
Varela Benitez et al.

(10) Patent No.: US 11,395,443 B2
(45) Date of Patent: Jul. 19, 2022

(54) LIQUID PUMPING UNITS, AND RELATED SYSTEMS AND METHODS

(71) Applicant: CoolIT Systems, Inc., Calgary (CA)

(72) Inventors: Sebastian Varela Benitez, Calgary (CA); Dennis Trieu, Calgary (CA); Brydon Gierl, Calgary (CA); Kamal Mostafavi, Calgary (CA); Cameron Turner, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 0 days.

(21) Appl. No.: 17/307,815

(22) Filed: May 4, 2021

(65) Prior Publication Data

US 2021/0352830 A1    Nov. 11, 2021

Related U.S. Application Data

(60) Provisional application No. 63/023,185, filed on May 11, 2020.

(51) Int. Cl.
*F04B 53/22* (2006.01)
*F04D 29/00* (2006.01)
(Continued)

(52) U.S. Cl.
CPC ......... *H05K 7/20781* (2013.01); *F04B 19/00* (2013.01); *F04D 29/026* (2013.01);
(Continued)

(58) Field of Classification Search
None
See application file for complete search history.

(56) References Cited

U.S. PATENT DOCUMENTS

| 3,073,385 A | 1/1963 | Peters |
| 3,481,393 A | 12/1969 | Chu |

(Continued)

FOREIGN PATENT DOCUMENTS

| CN | 102252488 A | 11/2011 |
| CN | 102483242 A | 5/2012 |

(Continued)

OTHER PUBLICATIONS

Notice of Allowance in Taiwan Application No. 103109612, dated Dec. 11, 2015.

(Continued)

*Primary Examiner* — Courtney L Smith
(74) *Attorney, Agent, or Firm* — Ganz Pollard, LLC

(57) ABSTRACT

A pump tray has a liquid pump with an inlet and outlet. A blindly matable liquid coupler fluidicly couples with the pump inlet and a blindly matable liquid coupler fluidicly couples with the pump outlet. A chassis of the pump tray has an alignment member configured to removably engage with another device and to restrict, to a limited number of degrees-of-freedom, movement of the chassis relative to the other device (e.g., a liquid pumping unit). The blindly matable liquid couplers are so physically coupled with the chassis as to inhibit movement of them relative to the chassis. A liquid pumping unit also has a chassis defining a bay configured to receive a pump tray, a liquid inlet coupler and a liquid outlet coupler, and a reservoir fluidicly coupled with the liquid inlet coupler. A blindly-matable liquid coupler fluidicly couples with the reservoir outlet and a blindly-matable liquid coupler fluidicly couples with the liquid outlet coupler. An alignment member is configured to removably engage with the pump tray and to restrict, to a limited number of degrees-of-freedom, movement of the pump tray relative to the chassis of the liquid pumping unit.

19 Claims, 24 Drawing Sheets

(51) Int. Cl.
*H05K 7/20* (2006.01)
*G06F 1/20* (2006.01)
*F04B 19/00* (2006.01)
*F04D 29/02* (2006.01)

(52) U.S. Cl.
CPC ......... *G06F 1/206* (2013.01); *H05K 7/20272* (2013.01); *H05K 7/20772* (2013.01); *F04B 53/22* (2013.01); *G06F 2200/201* (2013.01)

(56) References Cited

U.S. PATENT DOCUMENTS

| | | | |
|---|---|---|---|
| 3,792,284 | A | 2/1974 | Kaelin |
| 3,939,328 | A | 2/1976 | Davis |
| 4,060,997 | A | 12/1977 | Shultz et al. |
| 4,190,879 | A | 2/1980 | Tissot |
| 4,340,111 | A | 7/1982 | Skala |
| 4,450,472 | A | 5/1984 | Tuckerman et al. |
| 4,484,682 | A | 11/1984 | Crow |
| 4,495,777 | A | 1/1985 | Babington |
| 4,520,298 | A | 5/1985 | Abbondanti |
| 4,561,040 | A | 12/1985 | Eastman et al. |
| 4,564,040 | A | 1/1986 | Rudelick |
| 4,750,086 | A | 6/1988 | Mittal |
| 4,758,926 | A | 7/1988 | Herrell et al. |
| 4,768,581 | A | 9/1988 | Gotwald et al. |
| 4,777,578 | A | 10/1988 | Jahns |
| 4,898,153 | A | 2/1990 | Sherwood |
| 4,909,315 | A | 3/1990 | Nelson et al. |
| 4,940,085 | A | 7/1990 | Nelson et al. |
| 5,016,090 | A | 5/1991 | Galyon et al. |
| 5,070,936 | A | 12/1991 | Carroll et al. |
| 5,099,311 | A | 3/1992 | Bonde et al. |
| 5,142,214 | A | 8/1992 | Purson et al. |
| 5,203,401 | A | 4/1993 | Hamburgen et al. |
| 5,218,515 | A | 6/1993 | Bernhardt |
| 5,265,670 | A | 11/1993 | Zingher |
| 5,294,830 | A | 3/1994 | Young et al. |
| 5,309,319 | A | 5/1994 | Messina |
| 5,441,102 | A | 8/1995 | Hoy |
| 5,453,641 | A | 9/1995 | Mundinger et al. |
| 5,522,452 | A | 6/1996 | Mizuno et al. |
| 5,535,818 | A | 7/1996 | Fujisaki et al. |
| 5,577,706 | A | 11/1996 | King |
| 5,592,363 | A | 1/1997 | Atarashi et al. |
| 5,628,199 | A | 5/1997 | Hoglund et al. |
| 5,636,653 | A | 6/1997 | Titus |
| 5,646,824 | A | 7/1997 | Ohashi et al. |
| 5,684,671 | A | 11/1997 | Hobbs et al. |
| 5,727,618 | A | 3/1998 | Mundinger et al. |
| 5,731,954 | A | 3/1998 | Cheon |
| 5,823,249 | A | 10/1998 | Batchelder |
| 5,835,347 | A | 11/1998 | Chu |
| 5,864,464 | A | 1/1999 | Lin |
| 5,875,637 | A | 3/1999 | Paetow |
| 5,998,240 | A | 12/1999 | Hamilton et al. |
| 6,019,165 | A | 2/2000 | Batchelder |
| 6,024,175 | A | 2/2000 | Moore, Jr. et al. |
| 6,035,655 | A | 3/2000 | Hare et al. |
| 6,256,378 | B1 | 7/2001 | Iggulden et al. |
| 6,327,145 | B1 | 12/2001 | Lian et al. |
| 6,330,525 | B1 | 12/2001 | Hays et al. |
| 6,415,853 | B1 | 7/2002 | Tao et al. |
| 6,415,860 | B1 | 7/2002 | Kelly et al. |
| 6,447,270 | B1 | 9/2002 | Schmidt et al. |
| 6,470,289 | B1 | 10/2002 | Peters et al. |
| 6,679,315 | B2 | 1/2004 | Cosley et al. |
| 6,702,002 | B2 | 3/2004 | Wang |
| 6,769,258 | B2 | 8/2004 | Pierson |
| 6,775,137 | B2 | 8/2004 | Chu et al. |
| 6,792,373 | B2 | 9/2004 | Tabor |
| 6,819,563 | B1 | 11/2004 | Chu et al. |
| 6,827,128 | B2 | 12/2004 | Philpott et al. |
| 6,883,347 | B2 | 4/2005 | Ayub |
| 6,896,066 | B2 | 5/2005 | Gil |
| 6,952,345 | B2 | 10/2005 | Weber et al. |
| 6,970,355 | B2 | 11/2005 | Ellsworth et al. |
| 6,973,801 | B1 | 12/2005 | Campbell et al. |
| 6,986,382 | B2 | 1/2006 | Upadhya et al. |
| 6,988,534 | B2 | 1/2006 | Kenny et al. |
| 6,993,421 | B2 | 1/2006 | Pillar |
| 7,000,684 | B2 | 2/2006 | Kenny et al. |
| 7,007,506 | B2 | 3/2006 | Kubo et al. |
| 7,012,807 | B2 | 3/2006 | Chu et al. |
| 7,021,367 | B2 | 4/2006 | Oikawa |
| 7,029,647 | B2 | 4/2006 | Tonkovich et al. |
| 7,032,651 | B2 | 4/2006 | Winslow et al. |
| 7,044,198 | B2 | 5/2006 | Matsushima et al. |
| 7,057,893 | B2 | 6/2006 | Nicolai et al. |
| 7,086,247 | B2 | 8/2006 | Campbell et al. |
| 7,104,312 | B2 | 9/2006 | Goodson et al. |
| 7,123,996 | B2 | 10/2006 | Fukushima et al. |
| 7,124,811 | B2 | 10/2006 | Crocker et al. |
| 7,131,486 | B2 | 11/2006 | Goodson et al. |
| 7,143,816 | B1 | 12/2006 | Ghosh et al. |
| 7,149,084 | B2 | 12/2006 | Matsushima et al. |
| 7,156,159 | B2 | 1/2007 | Lovette et al. |
| 7,190,580 | B2 | 3/2007 | Bezama et al. |
| 7,201,217 | B2 | 4/2007 | Johnson et al. |
| 7,206,203 | B2 | 4/2007 | Campbell et al. |
| 7,209,355 | B2 | 4/2007 | Koga et al. |
| 7,221,270 | B2 | 5/2007 | Chen et al. |
| 7,264,359 | B2 | 9/2007 | Kawahara et al. |
| 7,274,566 | B2 | 9/2007 | Campbell et al. |
| 7,278,273 | B1 | 10/2007 | Whitted et al. |
| 7,301,771 | B2 | 11/2007 | Hata et al. |
| 7,315,448 | B1 | 1/2008 | Bash et al. |
| 7,318,322 | B2 | 1/2008 | Ota et al. |
| 7,331,378 | B2 | 2/2008 | Bhatti et al. |
| 7,360,582 | B2 | 4/2008 | Olesen |
| 7,397,661 | B2 | 7/2008 | Campbell et al. |
| 7,405,935 | B1 | 7/2008 | Carey |
| 7,455,103 | B2 | 11/2008 | Sato et al. |
| 7,466,549 | B2 | 12/2008 | Dorrich et al. |
| 7,466,553 | B2 | 12/2008 | Hamman |
| 7,484,530 | B2 | 2/2009 | Harvey et al. |
| 7,484,552 | B2 * | 2/2009 | Pfahnl .................. F28D 1/0535 165/104.33 |
| 7,486,513 | B2 | 2/2009 | Hall et al. |
| 7,527,085 | B2 | 5/2009 | Iijima et al. |
| 7,591,302 | B1 | 9/2009 | Lenehan et al. |
| 7,599,184 | B2 | 10/2009 | Upadhya et al. |
| 7,639,499 | B1 | 12/2009 | Campbell et al. |
| 7,660,116 | B2 | 2/2010 | Classen et al. |
| 7,688,589 | B2 | 3/2010 | Chiang |
| 7,757,506 | B2 | 7/2010 | Ellsworth, Jr. et al. |
| 7,762,314 | B2 | 7/2010 | Campbell et al. |
| 7,791,882 | B2 | 9/2010 | Chu et al. |
| 7,806,168 | B2 | 10/2010 | Upadhya et al. |
| 7,874,171 | B2 | 1/2011 | Park |
| 7,905,106 | B2 * | 3/2011 | Attlesey .................. F28F 9/007 62/259.2 |
| 7,925,746 | B1 | 4/2011 | Melton |
| 7,944,694 | B2 | 5/2011 | Campbell et al. |
| 7,957,144 | B2 | 6/2011 | Goettert et al. |
| 7,961,465 | B2 | 6/2011 | Goldrian |
| 7,969,727 | B2 | 6/2011 | Tozer et al. |
| 7,971,632 | B2 | 7/2011 | Eriksen |
| 7,978,472 | B2 | 7/2011 | Campbell et al. |
| 8,051,898 | B2 | 11/2011 | Chiang |
| 8,066,057 | B2 | 11/2011 | Olesen |
| 8,240,362 | B2 | 8/2012 | Eriksen |
| 8,245,764 | B2 | 8/2012 | Eriksen |
| 8,250,879 | B2 | 8/2012 | Macbain et al. |
| 8,418,487 | B2 | 4/2013 | King |
| 8,427,831 | B2 | 4/2013 | Wei |
| 8,437,129 | B2 | 5/2013 | Tung et al. |
| 8,441,789 | B2 | 5/2013 | Wu et al. |
| 8,472,182 | B2 * | 6/2013 | Campbell .......... H05K 7/20781 361/679.49 |
| 8,493,738 | B2 | 7/2013 | Chainer et al. |
| 8,499,761 | B2 | 8/2013 | Jorczak et al. |
| 8,613,306 | B2 * | 12/2013 | Tang .................. H05K 7/20272 165/80.4 |

(56) References Cited

U.S. PATENT DOCUMENTS

| | | |
|---|---|---|
| 8,631,860 B2 | 1/2014 | Tang et al. |
| 8,724,315 B2 | 5/2014 | Branton |
| 8,746,330 B2 | 6/2014 | Lyon |
| 8,944,148 B2 | 2/2015 | Hawwa |
| 8,952,774 B2 | 2/2015 | Dolgonos |
| 9,052,252 B2 | 6/2015 | Lyon et al. |
| 9,057,567 B2 | 6/2015 | Lyon |
| 9,215,832 B2* | 12/2015 | Chang ............... H05K 7/20781 |
| 9,380,735 B2 | 6/2016 | Chang |
| 9,453,691 B2 | 9/2016 | Lyon |
| 9,496,200 B2* | 11/2016 | Lyon .................... H01L 23/473 |
| 9,603,284 B2 | 3/2017 | Lyon |
| 9,723,745 B2* | 8/2017 | Qi ....................... H05K 7/1409 |
| 10,335,230 B2 | 7/2019 | Willyard et al. |
| 10,364,809 B2 | 7/2019 | Lyon et al. |
| 10,365,667 B2 | 7/2019 | Lyon et al. |
| 10,609,839 B1 | 3/2020 | Archer et al. |
| 2002/0070007 A1 | 6/2002 | Calaman et al. |
| 2002/0153885 A1 | 10/2002 | Blossfeld |
| 2002/0189790 A1 | 12/2002 | Wong |
| 2003/0019234 A1 | 1/2003 | Wayburn et al. |
| 2003/0070792 A1 | 4/2003 | Tanaka et al. |
| 2003/0085028 A1 | 5/2003 | Galtz |
| 2003/0151130 A1 | 8/2003 | Cheon |
| 2003/0230400 A1 | 12/2003 | McCordic et al. |
| 2004/0008483 A1 | 1/2004 | Cheon |
| 2004/0040695 A1 | 3/2004 | Chesser et al. |
| 2004/0042171 A1 | 3/2004 | Takamatsu et al. |
| 2004/0042172 A1 | 3/2004 | Kusaka |
| 2004/0057211 A1 | 3/2004 | Kondo et al. |
| 2004/0070949 A1 | 4/2004 | Oikawa et al. |
| 2004/0100770 A1 | 5/2004 | Chu et al. |
| 2004/0104010 A1 | 6/2004 | Kenny et al. |
| 2004/0104012 A1 | 6/2004 | Zhou et al. |
| 2004/0104022 A1 | 6/2004 | Kenny et al. |
| 2004/0112585 A1 | 6/2004 | Goodson et al. |
| 2004/0123614 A1 | 7/2004 | Stewart |
| 2004/0160741 A1 | 8/2004 | Moss et al. |
| 2004/0182548 A1 | 9/2004 | Lovette et al. |
| 2004/0182560 A1 | 9/2004 | Kenny et al. |
| 2004/0188066 A1 | 9/2004 | Upadhya et al. |
| 2004/0188069 A1 | 9/2004 | Tomioka et al. |
| 2004/0206477 A1 | 10/2004 | Kenny et al. |
| 2004/0221604 A1 | 11/2004 | Ota |
| 2004/0240179 A1 | 12/2004 | Koga et al. |
| 2005/0069432 A1 | 3/2005 | Tomioka |
| 2005/0111187 A1 | 5/2005 | Berens et al. |
| 2005/0126747 A1 | 6/2005 | Chu et al. |
| 2005/0128705 A1 | 6/2005 | Chu et al. |
| 2005/0178531 A1 | 8/2005 | Huang et al. |
| 2005/0180107 A1 | 8/2005 | Naganawa et al. |
| 2005/0205241 A1 | 9/2005 | Goodson et al. |
| 2005/0211417 A1 | 9/2005 | Upadhya et al. |
| 2005/0241809 A1 | 11/2005 | Tomioka et al. |
| 2005/0243516 A1 | 11/2005 | Stefanoski et al. |
| 2005/0259397 A1 | 11/2005 | Bash et al. |
| 2005/0269061 A1 | 12/2005 | Brewer et al. |
| 2006/0002080 A1 | 1/2006 | Leija et al. |
| 2006/0002088 A1 | 1/2006 | Bezama et al. |
| 2006/0011329 A1 | 1/2006 | Wang et al. |
| 2006/0094347 A1 | 5/2006 | Tracy |
| 2006/0096738 A1 | 5/2006 | Kang et al. |
| 2006/0096740 A1 | 5/2006 | Zheng |
| 2006/0096743 A1 | 5/2006 | Lee et al. |
| 2006/0137863 A1 | 6/2006 | Lee et al. |
| 2006/0143439 A1 | 6/2006 | Arumugam et al. |
| 2006/0162903 A1 | 7/2006 | Bhatti et al. |
| 2006/0171801 A1 | 8/2006 | Manabe et al. |
| 2006/0185829 A1 | 8/2006 | Duan et al. |
| 2006/0185830 A1 | 8/2006 | Duan |
| 2006/0187638 A1 | 8/2006 | Vinson et al. |
| 2006/0225867 A1 | 10/2006 | Park et al. |
| 2006/0231238 A1 | 10/2006 | Ball |
| 2006/0254755 A1 | 11/2006 | Chen et al. |
| 2007/0029069 A1 | 2/2007 | Duan |
| 2007/0034356 A1 | 2/2007 | Kenny et al. |
| 2007/0039719 A1 | 2/2007 | Eriksen |
| 2007/0095512 A1 | 5/2007 | Chen et al. |
| 2007/0107886 A1 | 5/2007 | Chen |
| 2007/0125526 A1 | 6/2007 | Satou et al. |
| 2007/0131396 A1 | 6/2007 | Yu et al. |
| 2007/0163750 A1 | 7/2007 | Bhatti et al. |
| 2007/0193724 A1 | 8/2007 | Lin |
| 2007/0227704 A1 | 10/2007 | Nagai et al. |
| 2007/0227710 A1 | 10/2007 | Belady et al. |
| 2007/0256957 A1 | 11/2007 | Herrmann et al. |
| 2007/0272314 A1 | 11/2007 | Packham |
| 2007/0272392 A1 | 11/2007 | Ghosh et al. |
| 2007/0297136 A1 | 12/2007 | Konshak |
| 2008/0053641 A1 | 3/2008 | Lai et al. |
| 2008/0128114 A1 | 6/2008 | Lai et al. |
| 2008/0149321 A1 | 6/2008 | Tien |
| 2008/0179045 A1 | 7/2008 | Hu et al. |
| 2008/0205003 A1 | 8/2008 | Belady et al. |
| 2008/0225478 A1 | 9/2008 | Goettert et al. |
| 2008/0288124 A1 | 11/2008 | Huang |
| 2008/0304236 A1 | 12/2008 | Murakami et al. |
| 2009/0071625 A1 | 3/2009 | Lyon |
| 2009/0084522 A1 | 4/2009 | Foglieni |
| 2009/0101315 A1 | 4/2009 | Cheng |
| 2009/0120622 A1 | 5/2009 | Koch |
| 2009/0139698 A1 | 6/2009 | Robinson |
| 2009/0154096 A1 | 6/2009 | Iyengar et al. |
| 2009/0218072 A1 | 9/2009 | Eriksen |
| 2009/0228893 A1 | 9/2009 | Behrendt et al. |
| 2009/0306833 A1 | 12/2009 | Vinson et al. |
| 2009/0322543 A1 | 12/2009 | Crnkovich et al. |
| 2010/0065355 A1 | 3/2010 | Reddy |
| 2010/0085708 A1 | 4/2010 | Martin et al. |
| 2010/0101765 A1 | 4/2010 | Campbell et al. |
| 2010/0103620 A1 | 4/2010 | Campbell et al. |
| 2010/0139887 A1 | 6/2010 | Slessman |
| 2010/0179695 A1 | 7/2010 | Collins et al. |
| 2010/0182809 A1 | 7/2010 | Cullinane et al. |
| 2010/0206869 A1 | 8/2010 | Nelson et al. |
| 2010/0211669 A1 | 8/2010 | Dalgas et al. |
| 2010/0313576 A1 | 12/2010 | Goenka |
| 2010/0324962 A1 | 12/2010 | Nesler et al. |
| 2010/0326634 A1 | 12/2010 | Eriksen |
| 2011/0084839 A1 | 4/2011 | Groth et al. |
| 2011/0100045 A1 | 5/2011 | Carlson |
| 2011/0100618 A1 | 5/2011 | Carlson |
| 2011/0115223 A1 | 5/2011 | Stahlkopf et al. |
| 2011/0127027 A1 | 6/2011 | Kashirajima et al. |
| 2011/0154842 A1 | 6/2011 | Heydari et al. |
| 2011/0168379 A1 | 7/2011 | Morgan et al. |
| 2011/0174001 A1 | 7/2011 | Carlson et al. |
| 2011/0175498 A1 | 7/2011 | Bash et al. |
| 2011/0303394 A1 | 12/2011 | Branton |
| 2011/0313576 A1* | 12/2011 | Nicewonger .......... F28D 15/00 700/282 |
| 2011/0315407 A1 | 12/2011 | Park et al. |
| 2012/0014068 A1 | 1/2012 | Nakanishi |
| 2012/0103009 A1 | 5/2012 | Ding et al. |
| 2012/0120608 A1 | 5/2012 | Guan |
| 2012/0147553 A1 | 6/2012 | Eriksen |
| 2012/0152498 A1 | 6/2012 | Lyon |
| 2012/0175094 A1 | 7/2012 | Rice |
| 2012/0271567 A1 | 10/2012 | Da Pont et al. |
| 2012/0273159 A1 | 11/2012 | Eriksen |
| 2013/0025818 A1 | 1/2013 | Lyon et al. |
| 2013/0107453 A1 | 5/2013 | Chainer et al. |
| 2013/0288630 A1 | 10/2013 | Suzuki |
| 2014/0103950 A1 | 4/2014 | Janitch |
| 2014/0147289 A1 | 5/2014 | Tian et al. |
| 2014/0158326 A1 | 6/2014 | Lyon |
| 2014/0186156 A1 | 7/2014 | Lai et al. |
| 2014/0141162 A1 | 9/2014 | Lyon et al. |
| 2014/0251582 A1 | 9/2014 | Lyon |
| 2014/0262180 A1 | 9/2014 | Lyon et al. |
| 2014/0266744 A1 | 9/2014 | Lyon et al. |
| 2015/0083368 A1 | 3/2015 | Lyon |
| 2015/0108934 A1 | 4/2015 | Wong et al. |
| 2015/0168474 A1 | 6/2015 | Yoshioka et al. |

(56) References Cited

U.S. PATENT DOCUMENTS

| | | |
|---|---|---|
| 2015/0355630 A1 | 12/2015 | Cader |
| 2016/0281704 A1 | 9/2016 | Lyon et al. |
| 2016/0377355 A1 | 12/2016 | Lyon |
| 2017/0064874 A1 | 3/2017 | Lyon et al. |
| 2017/0068258 A1 | 3/2017 | Lyon et al. |
| 2017/0196116 A1 | 7/2017 | Lyon |

FOREIGN PATENT DOCUMENTS

| | | | |
|---|---|---|---|
| CN | 103419937 | A | 12/2013 |
| CN | 106958978 | A | 7/2017 |
| CN | 206930036 | U | 1/2018 |
| CN | 207702811 | U | 8/2018 |
| DE | 202012002974 | U1 | 7/2012 |
| EP | 1808892 | A2 | 7/2007 |
| JP | S61-32449 | A | 2/1986 |
| JP | 06120387 | A | 4/1994 |
| JP | 7-183678 | A | 7/1995 |
| JP | 10-173114 | A | 6/1998 |
| JP | 2001-255027 | A | 9/2001 |
| JP | 2002151638 | A | 5/2002 |
| JP | 2003243581 | A | 8/2003 |
| JP | 200551600 | A | 12/2005 |
| JP | 2007180505 | A | 7/2007 |
| JP | 2007227902 | A | 9/2007 |
| JP | 2007531991 | A | 11/2007 |
| JP | 2008140879 | A | 6/2008 |
| JP | 2009529621 | A | 8/2009 |
| JP | 2011114206 | A | 6/2011 |
| JP | 3179086 | | 10/2012 |
| TW | M273031 | U | 8/2005 |
| TW | M298733 | U | 10/2006 |
| TW | I266039 | B | 11/2006 |
| TW | 201305522 | A | 2/2013 |
| TW | 201320883 | A | 5/2013 |
| TW | 201441626 | A | 11/2014 |
| TW | I531795 | B | 5/2016 |
| TW | I540955 | B | 7/2016 |
| TW | I606224 | B | 11/2017 |
| TW | M587771 | | 12/2019 |
| WO | 9202117 | | 2/1992 |
| WO | 0165900 | A1 | 9/2001 |
| WO | 03055055 | A1 | 7/2003 |
| WO | 2005017468 | A2 | 2/2005 |
| WO | 2005096377 | A1 | 10/2005 |
| WO | 2006052317 | A2 | 5/2006 |
| WO | 2007029253 | A2 | 3/2007 |
| WO | 2014141162 | A1 | 9/2014 |

OTHER PUBLICATIONS

Office Action for Japanese Application No. 2012-002117, dated May 7, 2012.
Office Action for Taiwan Application No. 103109612, dated Sep. 21, 2015.
Decision of Institution of Inter Partes Review. Filed Dec. 9, 2015 in Case IPR2015-01276.
Patent Owner's Preliminary Response of U.S. Pat. No. 9,496,200, United States Patent and Trademark Office, Before the Patent and Trial Appeal Board, *Asetek Denmark A/S v. CoolIT Systems, Inc.*, IPR No. 2019-00705, filed Jun. 13, 2019, 29 pages.
Petition for Inter Partes Review of U.S. Pat. No. 8,749,968; United States Patent and Trademark Office, Before the 5 Patent Trial and Appeal Board, *CoolIT Systems, Inc. v. Asetek A/S*, Inter Partes Review No. 2014-01172, Jul. 16, 2014 61 pages.
Petition for Inter Partes Review of U.S. Pat. No. 9,496,200, United States Patent and Trademark Office, Before the Patent and Trial Appeal Board, *Asetek Denmark A/S v. CoolIT Systems, Inc.*, IPR No. 2019-00705, filed Mar. 4, 2019, 73 pages.
Petition for Inter Parties Review of U.S. Pat. No. 8,746,330 in *Asetek Danmark A/S v. CoolIT Systems Inc.* filed May 27, 2015.
Petitioner's Reply to Patent Owner's Preliminary Response of U.S. Pat. No. 9,496,200,United States Patent and Trademark Office,Before the Patent and Trial Appeal Board, *Asetek Denmark A/S v. CoolIT Systems, Inc.*,IPR No. 2019-00705, filed Jun. 28, 2019, 7 pages.
Patent Owner's Response. Filed Mar. 9, 2016 in Case IPR2015-01276.
Preissuance Submission Dated Jan. 9, 2015, in U.S. Appl. No. 13/401,618.
Restriction Requirement for U.S. Appl. No. 13/559,340, dated Oct. 31, 2014.
Restriction Requirement for U.S. Appl. No. 14/183,443, dated May 22, 2014.
Restriction Requirement for U.S. Appl. No. 14/210,165, dated Jun. 12, 2014.
Restriction Requirement for U.S. Appl. No. 14/217,080, dated Sep. 21, 2016.
Restriction Requirement for U.S. Appl. No. 14/283,163, dated Jun. 13, 2014.
Restriction Requirement for U.S. Appl. No. 14/550,952, dated Feb. 5, 2015.
Restriction Requirement for U.S. Appl. No. 12/189,476, dated Jan. 24, 2012.
Restriction Requirement for U.S. Appl. No. 13/401,618, dated Sep. 18, 2014.
Restriction requirement for U.S. Appl. No. 15/351,362, dated dated Nov. 16, 2018.
Search Report for Taiwan Application No. 101127180, dated May 21, 2015.
Technical Opinion for Japanese Utility Model Application No. 2012-002117, dated Jan. 10, 2013; English translation included; 7 pages.
Third Party Preissuance Submission for U.S. Appl. No. 13/559,340, dated Jan. 9, 2015.
Roy W. Knight et al., "Heat Sink Optimization with Application to Microchannels," IEEE Transactions on Components, Hybrids, and Manufacturing Technology, vol. 15, No. 5, Oct. 1992, pp. 832-842.
Steineke, M. and Kandlikar, S., "Single-Phase Heat Transfer Enhancement Techniques in Microchannel and Minichannel Flows," Microchannels and Minichannels—Jun. 17-19, 2004, Rochester, New York, USA (2004).
Ellsworth, M.J. Jr. et al., "The Evolution of Water Cooling for IBM Large Server Systems Back To the Future," IEEE, CoolIT Systems Inc. Exhibit 1017, pp. 1-9, (2008).
Ellsworth, M.J. Jr. P.E., "Thermal Design and Implementation of Robust Liquid Cooling Systems for High Performance Computer Systems," Systems and Technology Group, IBM, InterPACK '11, dated Jul. 6-8, 2011, pp. 1-64.
Kandlikar, S.G., "High Flux Heat Removal with Microchannels. A Roadmap of Challenges and Opportunities," Heat Transfer Engineering. vol. 26 No. 8 : 5-14, (2005), pp. 5-14.
Schmidt, R.R., "Liquid Cooling is Back," Electronics Cooling Magazine, Published Aug. 1, 2005, Retrieved from the Internet URL: https://www.electronics-cooling.com/2005/08/liquid-cooling-is-back/, on Apr. 30, 2014, pp. 1-7.
Torres, G., "CoolIT Water-Cooling Products," Published Jan. 14, 2008, Retrieved from Internet URL: http://www.hardwaresecrets.com/coolit-water-cooling-products/3/, on Apr. 24, 2014, pp. 1-9.
Vertal, L., "Water Cooling Comes of Age, Again," Asetek Data Center Liquid Cooling, Published on Oct. 11, 2013, Retrieved from the Internet URL: htt5s://www.asetek.com/press-room/blog/2013/water-cooling-comes-of-age-again/, on Nov. 9, 2015, pp. 1-4.
Patent Owner's Surreply in Support of Patent Owner's Preliminary Response of U.S. Pat. No. 9,496,200, United States Patent and Trademark Office, Before the Patent and Trial Appeal Board, *Asetek Denmark A/S v. CoolIT Systems, Inc.*, IPR No. 2019-00705.
Declaration of Steven B. Branton, from Petition for Inter Parties Review of U.S. Pat. No. 9,496,200, in *Asetek Denmark A/S/ v. CoolIT Systems, Inc.* IPR No. 2019-00705, dated Feb. 26, 2019 7 pages.
Non-Final Office Action for U.S. Appl. No. 12/189,476, dated Apr. 13, 2012.
Non-Final Office Action for U.S. Appl. No. 13/401,618, dated Jul. 28, 2015.
English Translation of Examination and Search Report for Taiwan Application No. 103109612, dated Jan. 1, 2015.

(56) References Cited

OTHER PUBLICATIONS

English translation of Examination Report in Taiwan Application No. 101110072, dated Feb. 8, 2017.
Non-Final Office Action for U.S. Appl. No. 14/283,163, dated Sep. 4, 2015.
Non-Final Office Action for U.S. Appl. No. 14/283,163, dated Sep. 30, 2014.
English translation of Notice of Allowance in Taiwan Application No. 101127180, dated Feb. 19, 2016.
English translation of Second Technical Opinion for Japanese Utility Model Application No. 2012-002117 dated Jul. 19, 2013.
Non-Final Office Action for U.S. Appl. No. 14/777,510, dated Oct. 11, 2017.
Ex Parte Quayle Action for U.S. Appl. No. 14/210,165, dated Feb. 5, 2015.
Final Office Action for U.S. Appl. No. 12/189,476, dated Jan. 7, 2013.
Final Office Action for U.S. Appl. No. 15/462,753, dated Sep. 15, 2017.
Final Office Action for U.S. Appl. No. 14/550,952, dated Oct. 20, 2015.
Non-Final Office Action in U.S. Appl. No. 15/351,362, dated Feb. 7, 2019, 20 pages.
Final Office Action for U.S. Appl. No. 13/559,340, dated Sep. 8, 2015.
Notice of Allowance for U.S. Appl. No. 13/401,618, dated Jul. 27, 2016.
Examination Report dated Mar. 11, 2011, in European Patent Application No. 07075014.6; 9 pages.
Advisory Action for U.S. Appl. No. 13/559,340, dated Dec. 2, 2015.
Advisory Action for U.S. Appl. No. 14/283,163, dated Aug. 3, 2015.
Chinese-language Search and Examination Reports for Taiwan Patent Application No. 101110072, dated Apr. 9, 2014, (English translation included); 40 pages.
Declaration of Donald E. Tilton, PH.D, (including his CV) from Petition for Inter Parties Review of U.S. Pat. No. 9,496,200 in *Asetek Denmark A/S/* v. *CoolIT Systems, Inc.* IPR No. 2019-00705, dated Mar. 1, 2019 76 pages.
Declaration of Dr. Donald Tilton (including his CV) from Petition for Inter Parties Review of U.S. Pat. No. 8,746,330 in *Asetek Danmark A/S* v. *CoolIT Systems Inc.* dated May 27, 2015.
International Search Report and Written Opinion for PCT Application No. PCT/IB2021/0537660, dated Jul. 16, 2021, 8 pages.
Final Office Action for U.S. Appl. No. 13/401,618, dated Jan. 26, 2016.
Final Office Action for U.S. Appl. No. 14/283,163, dated May 14, 2015.
Final Office Action for U.S. Appl. No. 14/283,163, dated Jun. 15, 2016.
Notice of Allowance for U.S. Appl. No. 13/559,340, dated Sep. 23, 2016.
Notice of Allowance for U.S. Appl. No. 14/210,165, dated Feb. 20, 2015.
Final office action for U.S. Appl. No. 15/354,982 dated Oct. 9, 2018.
Final Office Action in U.S. Appl. No. 14/777,510, dated Jul. 30, 2018, 23 pages.
Notice of Allowance for U.S. Appl. No. 14/217,080, dated Nov. 1, 2017.
International Search Report and Written Opinion for PCT Application No. PCT/IB2014/059768, dated Jul. 9, 2014.
Merriam-Webster definition of beveled, Last accessed Jul. 1, 2021 (http://www.merriam-webster.com/dictionary/beveled).
Notice of Allowance for U.S. Appl. No. 14/283,163, dated Jan. 19, 2017.
Notice of Allowance for U.S. Appl. No. 14/183,443, dated Apr. 30, 2015.
Notice of Allowance for U.S. Appl. No. 12/189,476, dated Apr. 28, 2014.
Non-Final Office Action in U.S. Appl. No. 15/354,982, dated May 8, 2018, 19 pages.
Non-Final Office Action for U.S. Appl. No. 13/559,340, dated Jan. 15, 2016.
Notice of Allowance for U.S. Appl. No. 15/263,210, dated Oct. 30, 2017.
Non-Final Office Action for U.S. Appl. No. 13/559,340, dated Mar. 26, 2015.
Non-Final Office Action for U.S. Appl. No. 14/183,443, dated Oct. 30, 2014.
Non-Final Office Action for U.S. Appl. No. 14/210,165, dated Sep. 29, 2014.
Notice of Allowance in Taiwan Application No. 101110072, dated Aug. 17, 2017.
Non-Final Office Action for U.S. Appl. No. 14/217,080, dated Mar. 9, 2017.
Notice of Allowance in Taiwan Application No. 101127180, dated Feb. 19, 2016.
Non-Final Office Action for U.S. Appl. No. 14/550,952, dated Jul. 7, 2015.
Non-Final Office Action in U.S. Appl. No. 14/777,510, dated Apr. 23, 2018, 23 pages.
Non-Final Office Action for U.S. Appl. No. 15/263,210, dated Feb. 10, 2017.
Non-Final Office Action for U.S. Appl. No. 15/462,753, dated May 11, 2017.
Decision Inter Partes Review, IPR 2019-00705, entered Sep. 6, 2019, 22 pages.
Non-Final Office Action for U.S. Appl. No. 15/351,362, dated Nov. 18, 2019.
Final Written Decision, IPR 2019-00705, dated Aug. 21, 2020.
Non-Final Office Action for U.S. Appl. No. 16/525,303, dated Mar. 19, 2021, 13 pages.
Non-Final Office Action for U.S. Appl. No. 14/080,541, dated Jul. 13, 2016, 13 pages.
Office Action in Taiwan Application No. 110116975, dated Mar. 3, 2022, 5 pages.

* cited by examiner

SECTION A-A

LIQUID PUMPING UNITS, AND RELATED SYSTEMS AND METHODS

RELATED APPLICATIONS

This application claims benefit of and priority from U.S. Provisional Patent Application No. 63/023,185, which is hereby incorporated by reference in its entirety as if fully set forth herein, for all purposes.

This application pertains to concepts disclosed in U.S. patent application Ser. No. 16/158,227 filed on Oct. 11, 2018, which claims benefit of and priority from provisional U.S. Patent Application No. 62/571,420 filed on Oct. 12, 2017; U.S. patent application Ser. No. 15/354,982, which claims benefit of and priority from U.S. Patent Application No. 62/256,519, filed Nov. 17, 2015, and benefit of and priority from U.S. patent application Ser. No. 14/777,510, filed Sep. 15, 2015, which is a U.S. National Phase Application of International Patent Application No. PCT/IB2014/059768, filed Mar. 14, 2014, which claims benefit of and priority to U.S. Patent Application No. 61/793,479, filed Mar. 15, 2013, U.S. Patent Application No. 61/805,418, filed Mar. 26, 2013, U.S. Patent Application No. 61/856,566, filed Jul. 19, 2013, and U.S. Patent Application No. 61/880,081, filed Sep. 19, 2013, each of which patent applications is hereby incorporated by reference in its entirety as if fully set forth herein, for all purposes.

Other pertinent disclosures include U.S. Patent Application No. 61/522,247, filed Aug. 11, 2011, U.S. Patent Application No. 61/622,982, filed Apr. 11, 2012, U.S. Patent Application No. 61/794,698, filed Mar. 15, 2013, U.S. patent application Ser. No. 13/559,340, filed Jul. 26, 2012, now U.S. Pat. No. 9,496,200, U.S. Patent Application No. 61/908,043, filed Nov. 23, 2013, and U.S. patent application Ser. No. 14/550,952, filed Nov. 22, 2014, each of which patent applications is hereby incorporated by reference in its entirety as if fully set forth herein, for all purposes.

BACKGROUND

The innovations and related subject matter disclosed herein (collectively referred to as the "disclosure") pertain to electronics cooling systems, and more particularly, but not exclusively, to reservoir-and-pump units for liquid cooling systems used to cool electronics, as well as associated devices, systems, controllers and methods for distributing liquid coolant among a plurality of rack-mounted servers.

SUMMARY

Innovations and related subject matter disclosed herein overcome many problems in the prior art.

For example, as computing performance continues to increase with each successive generation of server (and each successive generation of processing units within those servers), heat dissipation correspondingly increases with each successive generation. Consequently, liquid-cooling technologies have become desirable within data centers and other computing installations for their ability to efficiently remove heat dissipated by processing units and other server components. However, data centers and other computing installations often require continuous or near-continuous "up time" for individual servers, as to altogether avoid or at least minimally disrupt computing resources provided by the individual servers.

Disclosed technologies can be configured to permit insertion or removal, or both, of selected devices within liquid cooling systems used to cool electronics while avoiding substantial or significant interruption to the cooling capacity of the cooling system. Devices having a reservoir and at least one pump are used throughout to explain principles that permit such insertion or removal. Nonetheless, disclosed principles are not so limited. Rather, disclosed principles can be incorporated in other devices for which insertion to or removal from, or both, a liquid circuit, whether open- or closed-loop, may be desired while avoiding substantial or significant interruption to the flow of liquid through the circuit. Sometimes, such insertion and/or removal of a device without substantial or significant interruption to a liquid flow is referred to in the electronics cooling art as "hot-swapping."

According to one aspect, a pump tray includes a liquid pump having an inlet and an outlet. A first blindly matable liquid coupler fluidicly is coupled with the pump inlet and a second blindly matable liquid coupler fluidicly is coupled with the pump outlet. The pump tray also includes a chassis having an alignment member configured to removably engage with another device. The alignment member is also configured to restrict, to a limited number of degrees-of-freedom, movement of the chassis relative to the other device. As well, the first blindly matable liquid coupler and the second blindly matable liquid coupler are so physically coupled with the chassis as to inhibit movement of the first blindly matable liquid coupler and the second blindly matable liquid coupler relative to the chassis.

The pump tray can include an insertion lever. The insertion lever can be configured to engage a complementary feature defined by the other device on actuating the insertion lever in a first direction. When so actuated, the insertion lever can urge one or both of the first blindly matable coupler and the second blindly matable liquid coupler to mate with a corresponding, complementarily configured liquid coupler of the other device.

The insertion lever can also be configured to latch in a closed position and to maintain a mated connection of one or both of the first blindly matable liquid coupler and the second blindly matable liquid coupler with the corresponding, complementarily configured liquid coupler(s) of the other device.

The pump tray can also include a limit switch. The limit switch can be so configured as to be actuated by movement of the insertion lever, movement of the chassis, or both.

The pump tray can include at least one blindly matable electrical connector configured to matingly engage or to matingly disengage from a complementary electrical connector in correspondence with insertion or removal of the chassis from the other device.

The other device can be (or can include) a reservoir. The first blindly matable liquid coupler can be configured to matingly engage a corresponding matable liquid coupler fluidicly coupled with the reservoir, fluidicly coupling the liquid pump with the reservoir of the other device.

The alignment member can define a slot configured to slidably receive a correspondingly configured rail defined by the other device.

The alignment member can define a flange configured to slidably engage corresponding structure defined by the other device.

According to another aspect, a liquid pumping unit has a chassis defining a bay. The bay is configured to receive a pump tray. The liquid pumping unit also has a liquid inlet coupler and a liquid outlet coupler. The liquid pumping unit further comprises a reservoir having a reservoir inlet and a reservoir outlet. The reservoir inlet is fluidicly coupled with the liquid inlet coupler. As well, the liquid pumping unit has a first blindly-matable liquid coupler fluidicly coupled with the reservoir outlet, and a second blindly-matable liquid coupler fluidicly coupled with the liquid outlet coupler. The liquid pumping unit also has an alignment member configured to removably engage with the pump tray and to restrict, to a limited number of degrees-of-freedom, movement of the pump tray relative to the chassis. The first blindly matable liquid coupler and the second blindly matable liquid coupler are so physically coupled with the chassis as to inhibit movement of the first blindly matable liquid coupler and the second blindly matable liquid coupler relative to the chassis.

Each of the first blindly matable liquid coupler and the second blindly matable liquid coupler can be configured to fluidicly couple with a corresponding blindly matable liquid coupler associated with the pump tray when the pump tray is inserted in the bay defined by the chassis.

The chassis can be configured to removably retain the pump tray in a stationary position when the pump tray is inserted in the bay defined by the chassis.

Each of the first blindly matable liquid coupler and the second blindly matable liquid coupler can also be configured to fluidicly decouple from the corresponding blindly matable liquid coupler associated with the pump tray, as when the pump tray is displaced from the stationary position.

The liquid pumping unit can include a limit switch. The limit switch can be configured to actuate during insertion or removal of the pump tray relative to the bay defined by the chassis.

The liquid pumping unit can also include at least one blindly matable electrical connector configured to matingly engage or to matingly disengage from a complementary electrical connector associated with the pump tray on insertion or removal, respectively, of the pump tray.

The alignment member can define a rail flange configured to slidably engage a correspondingly configured flange defined by the pump tray.

The alignment member can define a guide rail configured to slidably engage a corresponding slot defined by the pump tray.

The liquid pumping unit can include a removable pump tray. The removable pump tray can include a liquid pump having an inlet and an outlet. A third blindly matable liquid coupler can be fluidicly coupled with the pump inlet and can be configured to removably couple with the first blindly-matable liquid coupler to couple the reservoir outlet with the pump inlet. A fourth blindly matable liquid coupler can be fluidicly coupled with the pump outlet and can be configured to removably couple with the second blindly-matable liquid coupler to couple the pump outlet with the liquid outlet coupler.

The removable pump tray can also include an insertion lever configured to engage a complementary feature defined by the chassis. The insertion lever can be configured, on actuation of the lever in a first direction, to urge the pump tray into the bay.

The insertion lever can also be configured to latch in closed position, maintaining a first mated connection of the first blindly matable liquid coupler with the third blindly matable liquid coupler and a second mated connection of the second blindly matable liquid coupler with the fourth blindly matable liquid coupler.

The pump tray can be configured to urge outward of the bay and to decouple the first mated connection, the second mated connection, or both, when the insertion lever is released from the closed position.

Other innovative aspects of this disclosure will become readily apparent to those having ordinary skill in the art from a careful review of the following detailed description (and accompanying drawings), wherein various embodiments of disclosed innovations are shown and described by way of illustration. As will be realized, other and different embodiments of technologies incorporating one or more of the disclosed technologies are possible and several disclosed details are capable of being modified in various respects, each without departing from the spirit and scope of the principles disclosed herein. For example, the detailed description set forth below in connection with the appended drawings is intended to describe various principles pertaining to the disclosed technologies and is not intended to represent the only contemplated aspects of the technologies disclosed herein. Instead, the detailed description includes specific details for the purpose of providing a comprehensive understanding of the principles disclosed herein. Accordingly, the drawings and detailed description are to be regarded as illustrative in nature and not as restrictive.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

In FIG. 24, each pump-tray door is unlatched.

DETAILED DESCRIPTION

The following describes various principles related to electronics cooling systems, and more particularly, but not exclusively, to reservoir-and-pump units (also referred to as liquid pumping units) for liquid cooling systems used to cool electronics, as well as associated devices, systems, controllers and methods for distributing liquid coolant among a plurality of rack-mounted servers. Devices, systems, controllers and methods described in relation to particular configurations, applications, uses, or acts are merely examples of incorporating one or more of the principles disclosed herein and are used to illustrate one or more aspects of the disclosed principles.

Thus, devices, systems, controllers and methods having attributes that are different from those specific examples discussed herein can embody one or more aspects of the disclosed principles, and can be used in applications not described herein in detail, embodiments of devices, systems, controllers and methods not described herein in detail also fall within the scope of this disclosure, as will be appreciated by those of ordinary skill in the art following a review of this disclosure.

I. Overview

Referring now to FIGS. 1A through 1H, a typical server rack of the type used in a data center can accommodate 42 individual servers, each server corresponding to a cooling node within a heat-transfer system. Naturally, some server racks can accommodate more or fewer individual servers. And, some server racks might not be fully populated regardless of their capacity.

Figure 1A:
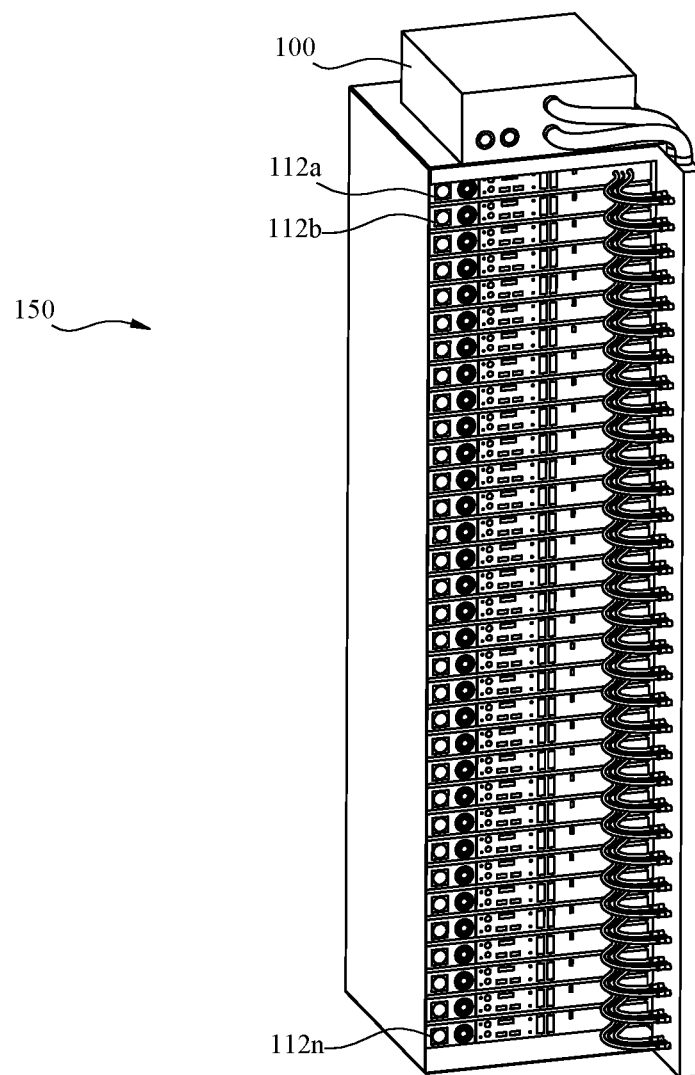
FIG. 1A illustrates a modular heat-transfer system configured to cool a plurality of independently operable, rack-mounted servers.

FIG. 1A shows an array 150 of independently operable servers 112a, 112b . . . 112n mounted in a rack, or chassis, together with aspects of a heat-transfer system for cooling the servers. In FIG. 1A, each server 112a-n has one or more corresponding heat sources.

A heat-transfer system can collect heat from each heat source and carry the heat to a suitable heat sink, e.g., a facility liquid, atmospheric air, and/or air in a conditioned room containing the rack of servers. Thus, such a heat-transfer system can include several different components arranged to dissipate heat from any of a variety of heat sources to one or more heat sinks.

For example, in FIG. 1A, a liquid pumping unit 100 is shown. A liquid pumping unit is sometimes referred to as a "coolant heat-exchange unit" when the liquid pumping unit incorporates a heat-exchanger to dissipate heat from a coolant passing through the liquid pumping unit. The liquid pumping unit also sometimes contains a reservoir and at least one pump, regardless of whether the liquid pumping unit incorporates a heat exchanger to dissipate heat from a coolant passing through the liquid pumping unit. Nonetheless, many reservoir-and-pump units do not incorporate a heat exchanger within the confines of the liquid pumping unit.

When a heat exchanger is included within the confines of the liquid pumping unit, as in FIG. 1A, the liquid pumping unit 100 can receive a warm coolant carrying heat from the servers 112a-n and facilitate transfer of that heat from the warm coolant to another medium. The liquid pumping unit 100 can return the cooled coolant to the servers to collect further heat from the servers. In other instances, the liquid pumping unit 100 receives cooled coolant from a heat exchanger outside the confines of the liquid pumping unit or delivers coolant to a heat exchanger outside the confines of the liquid pumping unit in order to cool the coolant before it circulates through the servers.

Figure 1B:
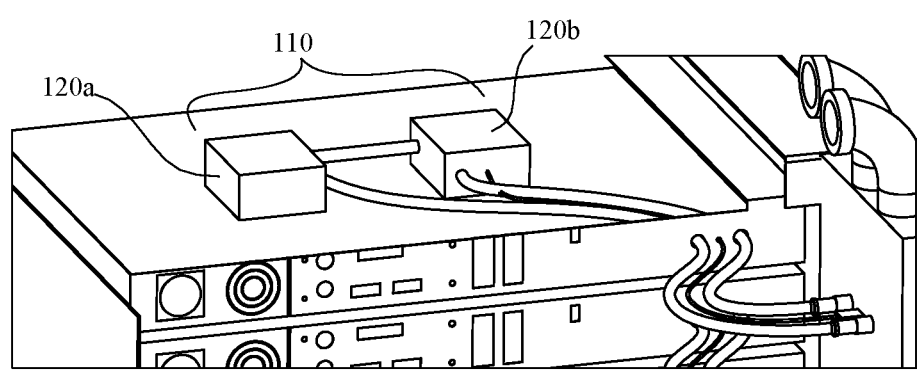
FIG. 1B shows an isometric view of a portion of the modular heat-transfer system shown in FIG. 1, together with features of a heat-transfer element.

FIG. 1B illustrates aspects of a representative heat-transfer element 110 within a heat-transfer system as shown in FIG. 1A. The illustrated heat-transfer element 110 corresponds to one of the servers 112a-n. The heat-transfer element 110 can be thermally coupled to a corresponding one or more components that dissipate(s) heat during operation of the respective server. In FIG. 1B, the heat-transfer element 110 has two constituent component heat-exchange modules 120a, 120b, each of which can be thermally coupled with a corresponding heat-dissipation element (e.g., a processing unit) within the respective server. As coolant passes through each respective heat-transfer module 120a, 120b, the coolant can absorb heat dissipated by the heat-dissipation element. The warmed coolant can then be carried to the liquid pumping unit 100, where the heat is transferred to another medium (e.g., facility water). Such an arrangement for cooling rack mounted servers is described in further detail in U.S. Pat. No. 9,496,200. Representative heat-exchange modules are described in further detail in U.S. Pat. Nos. 8,746,330 and 9,453,691. The heat-exchange modules can be passive, as in the '330 Patent, or they can be active, e.g., include a pump, as in the '691 Patent.

Figure 1C:
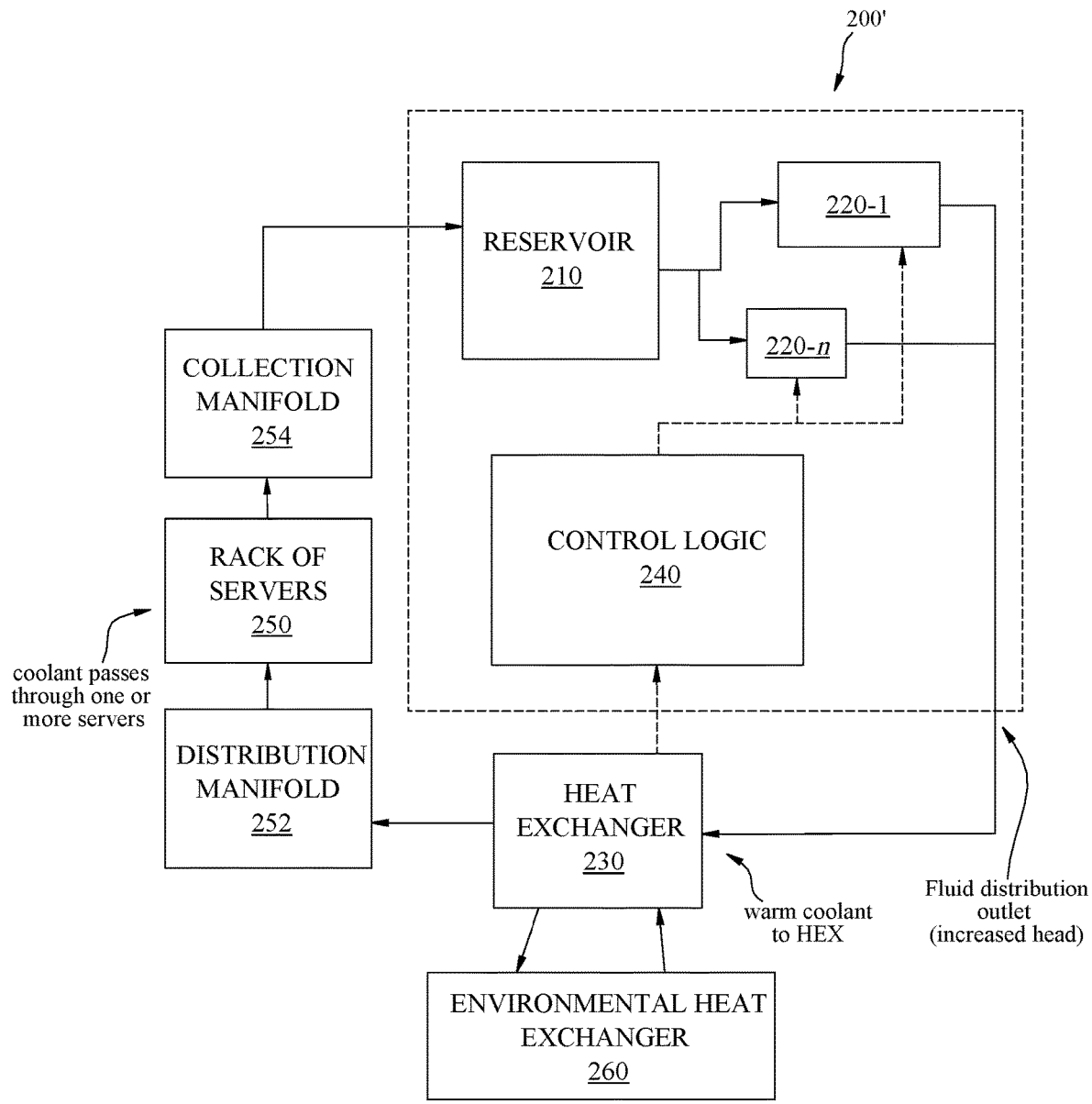
FIG. 1C shows a block diagram of a liquid-cooled heat exchange system configured to cool servers in a rack-mountable server system.

FIG. 1C schematically illustrates a cooling system suitable for cooling an array of rack mounted servers 250, similar to the rack of servers 150 in FIGS. 1A and 1B. In FIG. 1C, the liquid pumping unit 200' is arranged similarly to the liquid pumping unit 100 in FIG. 1A, except that in FIG. 1C, the heat exchanger 230 is positioned outside the confines of the liquid pumping unit 200'. The liquid pumping unit 200' includes a reservoir 210 and a plurality of distribution pumps 220-1 to 220-n. Coolant collected from the rack of servers 250 (e.g., by a collection manifold 254) can flow into the reservoir 210 and can be pumped by the distribution pump(s) 220-1 to 220-n to an environmental coupler (e.g., a heat exchanger 230). The heat exchanger 230 can facilitate cooling of the coolant warmed by the servers by rejecting heat from the coolant to another cooling medium, e.g., provided by a data center or other facility in which the rack mounted servers are installed or used.

The heat exchanger 230 can be a liquid-to-liquid heat exchanger, as when the coolant heated by the servers rejects that heat to another liquid medium (e.g., cool facility water). Alternatively, the heat exchanger 230 can be a liquid-to-air heat exchanger, as when the coolant heated by the servers rejects that heat to air (e.g., conditioned air within a data center or atmospheric air). It should be noted that although the term "liquid-to-air heat exchanger" is used, that term refers herein generally to a heat exchanger that transfers heat from a liquid to a gaseous medium, e.g., air or a gas other than air, as when the warm liquid coolant from the servers is cooled by a gaseous refrigerant, as can occur in an evaporator of a refrigeration cycle.

Figure 1D:
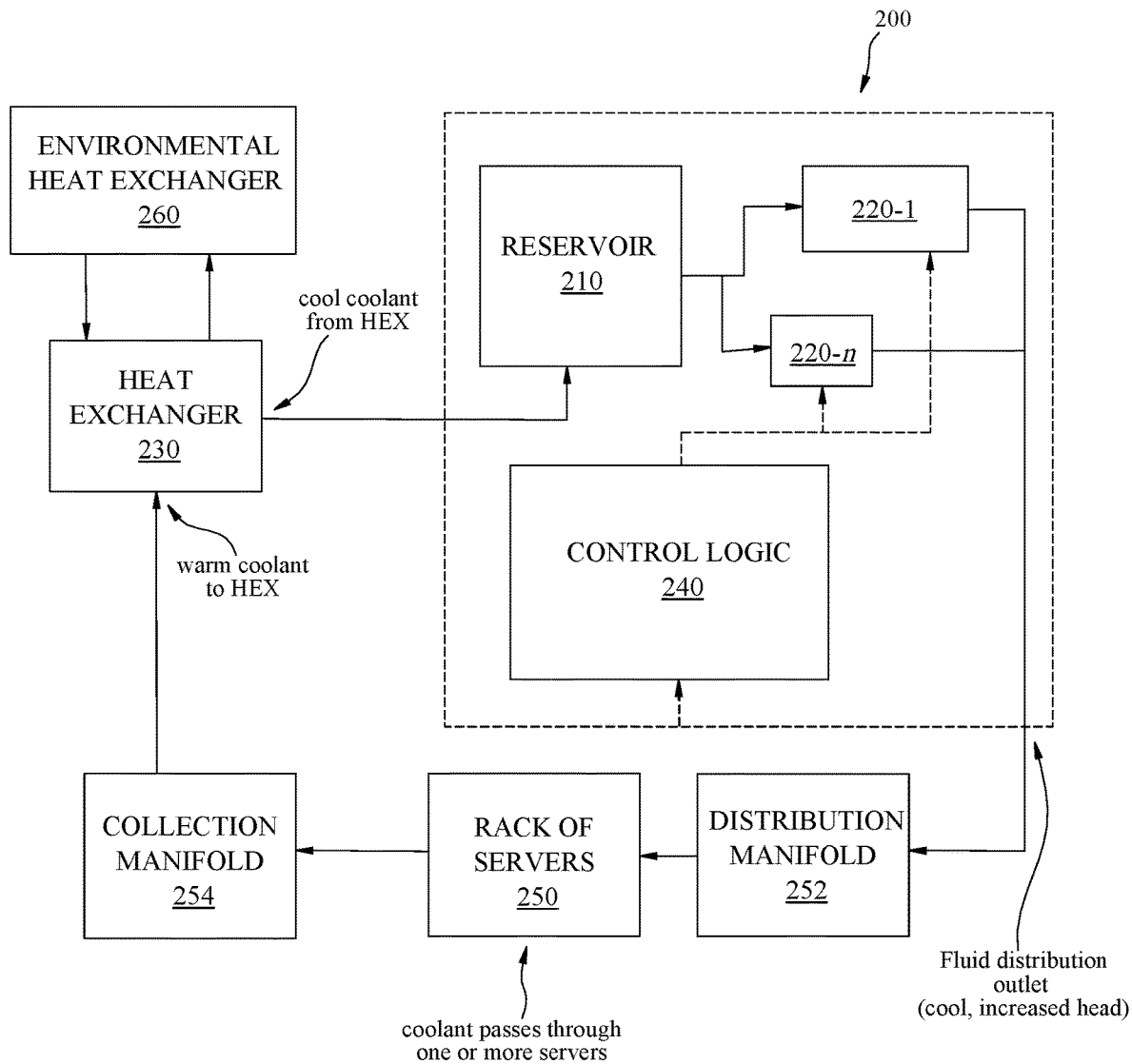
FIG. 1D illustrates another modular heat-transfer system configured to cool a plurality of independently operable, rack-mounted servers, with aspects of a liquid-cooling circuit shown.

In another configuration, the warm coolant from the collection manifold 254 can flow into the heat exchanger 230 and be cooled by a cooling medium before the coolant enters the reservoir 210. FIG. 1D illustrates such a coolant flow path. And, in yet another arrangement, the warm coolant from the servers can be cooled directly by the environmental heat exchanger 260, e.g., directly from the collection manifold or from one or more of the distribution pumps, without the intervening heat exchanger 230. In such an example, the liquid coolant that passes through the rack mounted servers can be cooled directly by a facility-level cooler (e.g., a cooling tower or other form of facility-level cooling device).

In FIG. 1D, cool, conditioned air from a data center can pass through a liquid-to-air heat exchanger (e.g., heat exchanger 230) to reject heat carried by a liquid coolant to the cool air. The heat carried by the liquid is absorbed by the liquid coolant as it passes through each server node 112a-n, as described above in relation to FIGS. 1A and 1B.

After rejecting heat and being cooled by the heat exchanger 230, the coolant can enter the liquid pumping unit 200 and flow into the reservoir 210. In either configuration shown in FIGS. 1C and 1D, the heat carried by the coolant can be transferred to another medium (e.g., facility water or cool data-center air), cooling the coolant flowing through the heat exchanger 230. Coolant can be delivered from the liquid pumping unit 200 (directly or via the heat exchanger 230) to the rack of servers 250 (e.g., distributed among the plurality of servers in the rack by the distribution manifold 252).

In FIGS. 1C and 1D, the liquid pumping unit 200, 200' includes control logic 240. The control logic can receive information from one or more sensors operatively coupled with any of the components, devices, structures, mechanisms, racks, servers, heat-transfer systems, processing units, computing environments, actuators, etc., described for example in U.S. patent application Ser. No. 16/158227 filed on Oct. 11, 2018, which claims benefit of and priority from provisional U.S. Patent Application No. 62/571,420 filed on Oct. 12, 2017, each of which is incorporated herein by reference. The control logic can process the received information and, responsive to an output of such processing, can emit one or more signals, commands, etc. A component, device, structure, mechanism, rack, server, heat-transfer system, processing unit, computing environment, actuator, etc., described herein can receive an emitted signal or command. Such component, device, structure, mechanism, rack, server, heat-transfer system, processing unit, computing environment, actuator, etc., described herein can respond to a received signal or command emitted by the control logic. Control logic can be implemented in a general-purpose computing environment, in an application specific integrated circuit, or in a combination of hardware and software (e.g., firmware).

II. Reservoir with Reduced Gas Entrainment and Cavitation

In closed-loop liquid systems, such as, for example, a liquid-based heat transfer system or other hydraulic system, liquid may be pumped from a reservoir, circulated to one or more other system components, and returned to the reservoir. The reservoir may be positioned in a selected region of the system, e.g., a liquid pumping unit. The reservoir may have air or other gas in it to accommodate changes in the liquid's volume in the reservoir, e.g., due to thermal expansion and contraction, despite that many liquids generally are considered and modeled to be incompressible. And, under sufficient pressures or temperatures, the liquid may change state (e.g., vaporize as through cavitation or separation from a surface) to form a saturated mixture (at least locally), reducing the mass of liquid while increasing a mass of gas in the closed system. It may, however, be undesirable to introduce a gas phase into other regions of the closed-loop system. For example, gas bubbles may damage pumps, or cause other harmful effects such as, but not limited to, overheating (e.g., as by blocking a flow of liquid through a passage in a heat exchanger).

Figure 2:
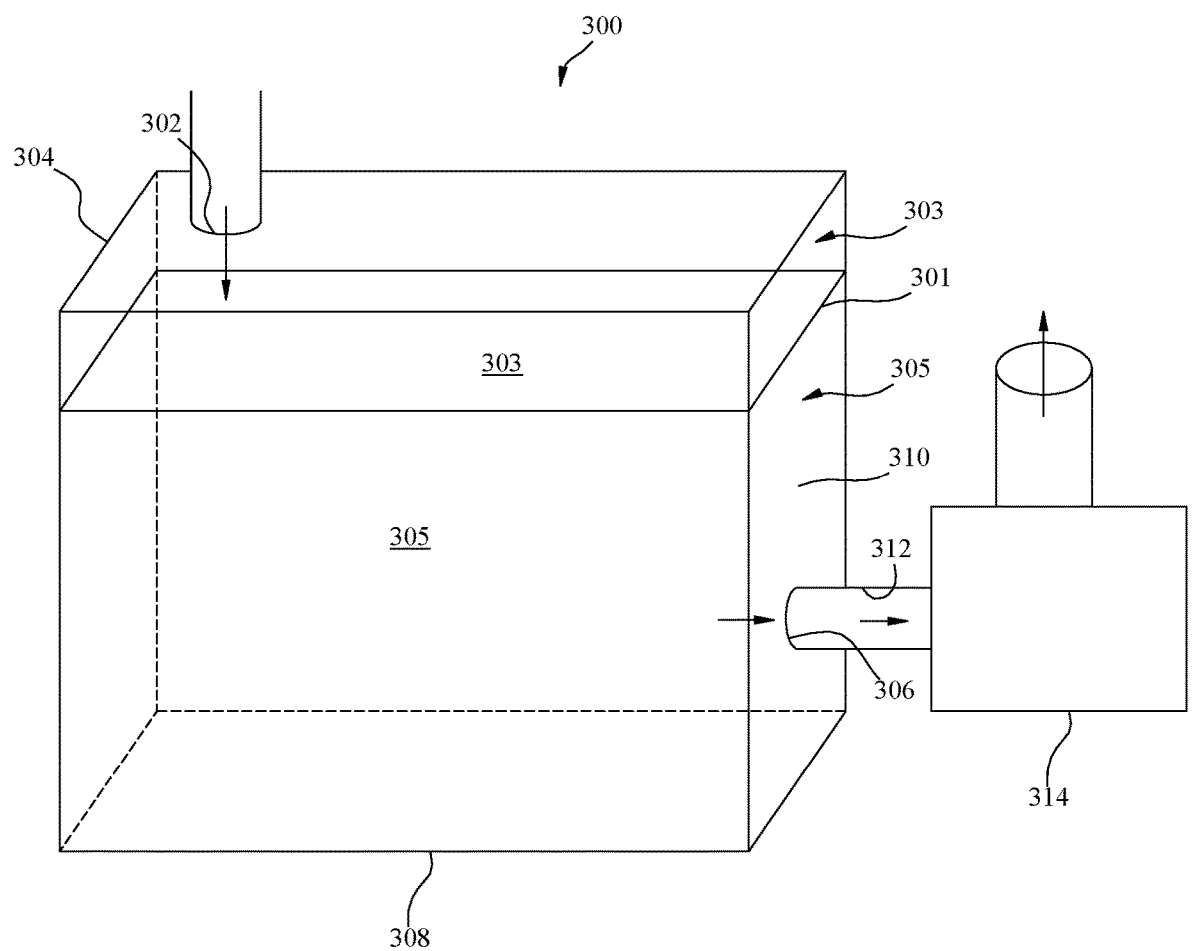
FIG. 2 shows an isometric view of a schematic illustration of a liquid pumping unit having a reservoir.

FIG. 2 shows an isometric view of a reservoir enclosure (sometimes also referred to herein as a "reservoir"). The illustrated reservoir is a sealed reservoir 300 (except for over-pressure relief valves that can automatically open when an internal pressure in the reservoir exceeds an upper threshold pressure) where the liquid enters from an inlet 302, e.g., positioned at or near a top wall 304 of the reservoir.

An outlet aperture 306, located adjacent a floor or other bottom wall 308 of the reservoir, e.g., on a side wall 310, connects to a liquid conduit 312 that may also connect to a pump 314. The line 301 indicates a level of a free surface of the liquid 305 in the reservoir. Gas is present in the volume 303 above the line 301. The gas may be air, or a relatively inert gas such as, for example, nitrogen, or a mixture of saturated vapor-phase of the liquid and air (or, e.g., nitrogen). When the liquid 305 exits the reservoir through the outlet 306, either due to a pump or due to gravity, the flow of the liquid through the outlet may begin to rotate, causing a vortex in a region of the fluid positioned adjacent the outlet, similar to a vortex that forms in a draining bathtub or sink. The vortex may entrain gas in the reservoir into the liquid and/or may cause cavitation to occur in the swirling flow. Under such conditions, gas may be entrained into the flow through the outlet 306 and introduce the gas into other regions of the closed loop system. As noted, entrained gas bubbles can deteriorate performance and even cause system damage.

Another potential source of damage to closed-loop liquid systems may include cavitation. Cavitation refers to the formation and collapse of vapor bubbles in a liquid, which can occur when a local static pressure in the liquid drops below the vapor pressure of the liquid. Cavitation can occur, for example, when a liquid passes through a flow constriction, as from a relatively large flow cross-section (e.g., within the enclosure 300) through a smaller cross-sectional area (e.g., through the aperture 306). For example, as a liquid-phase fluid passes from a reservoir to a tube, particularly by passing through a sharp-edged orifice, streamlines of the flow may constrict to a smaller diameter than a diameter (e.g., a hydraulic diameter) of the orifice, causing the flow to separate from the walls of the tube. In such a flow, a speed of the flow increases as the flow constricts, causing regions of lower pressure, e.g., usually at the edges of the transition area, where the liquid flow can separate from a boundary wall and locally cavitate. Once a cavitation (vapor) bubble moves back into a region of higher pressure, it collapses. The collapsing bubble releases a large amount of energy in a concentrated region and can erode surfaces of nearby structure (e.g., walls). Additionally, the vapor bubbles are substantially less dense than the liquid phase and therefore carry less mass, effectively reducing a flow rate of liquid through the cavitation region.

In some cases, a swirling flow may cavitate. For example, in a swirling flow such as a whirlpool, a local pressure within a vortex may drop to a pressure at or below the local vapor pressure of the liquid, inducing cavitation in those low-pressure regions.

Accordingly, various aspects of a reservoir of a closed-loop liquid system are described to inhibit or to altogether avoid entraining gas into the liquid conduits, and to inhibit or altogether prevent cavitation and its accompanying effects. In an embodiment, the shape and positioning of the outlet from the reservoir enclosure may reduce a likelihood of either or both entrainment and the effects of cavitation. For example, a "snorkel" may be added to draw fluid into a conduit from an interior region of the reservoir, as opposed to drawing fluid into the conduit from a sidewall as shown in FIG. 2. Such snorkels are described more fully below.

Additionally, or alternatively, baffles may be added into the reservoir to prevent or inhibit gas entrainment or cavitation, as by inhibiting large-scale swirling flows from forming, disrupting formation of large vortices, straightening flows, etc. Some baffles are described more fully in U.S. patent application Ser. No. 16/158227 filed on Oct. 11, 2018, which claims benefit of and priority from provisional U.S. Patent Application No. 62/571,420 filed on Oct. 12, 2017, which applications are hereby incorporated in their entirety. Alternative arrangements of baffles are described below in connection with one or more reservoir-and-pump units.

The illustrated reservoir 300 has a generally hollow, prismatic structure, e.g., as a hollow rectangular prism. Of course, hollow enclosures of other shapes are possible and can incorporate aspects described in relation to FIG. 2 and other embodiments of reservoirs described herein.

Figure 3:
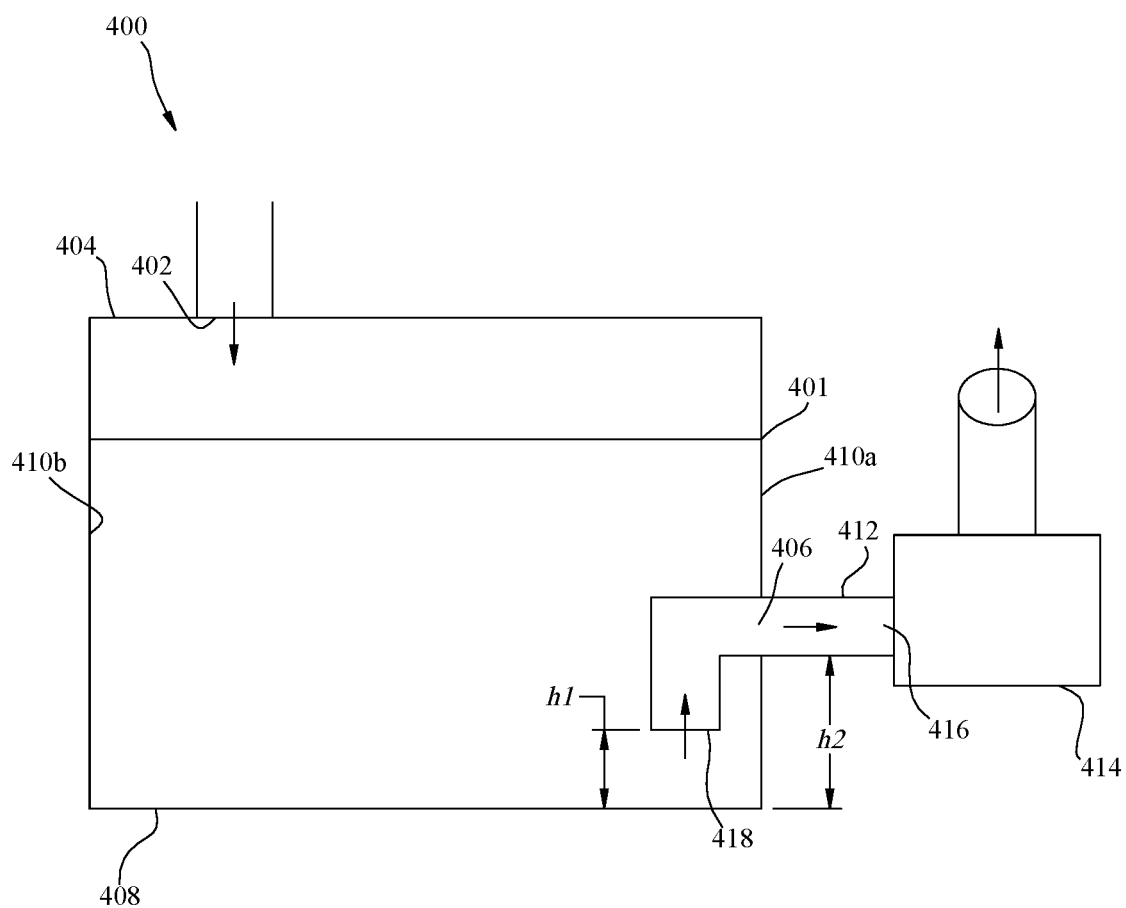
FIG. 3 shows a schematic, side-elevation view of another liquid pumping unit.

FIG. 3 shows a side view of a reservoir 400. As with the reservoir 300 in FIG. 2, a liquid may enter the reservoir 400 through an inlet 402 in the top 404 of the reservoir. The inlet may be positioned, alternatively, in a sidewall of the reservoir. An outlet conduit 412 is coupled to, and may pass through, an outlet aperture 406 in the side wall 410a. The outlet aperture 406 may be, alternatively, positioned in the floor, at an edge, or in a corner of the reservoir. The reservoir 400 may be sealed, such that substantially no gas or liquid can enter or leave the reservoir other than through the inlet 402 and the outlet aperture 406 through the wall 410a, or a pressure-relief valve (not shown).

The liquid conduit 412 (sometimes also referred to as a "snorkel") can extend from a first end to an opposed second end. The first end can be coupled with a pump such that an aperture 416 at the first end of the liquid conduit 412 is coupled directly or indirectly to an inlet to a pump 414. The liquid conduit 412 can extend through a side wall 410a such that the opposed second end of the liquid conduit 412 is positioned in the enclosure 400. An aperture 418 at the opposed second end of the snorkel 412 can draw liquid from the enclosure into the passageway of the conduit.

In another embodiment, the second end of the conduit 412 couples with the wall 410a, e.g., a flange on the wall. In such an embodiment, a second segment of conduit (not shown) can be coupled to the wall and extend inward from an interior surface of the enclosure to an opposed distal end of the second segment generally positioned as with the snorkel illustrated in FIG. 3. In general, the liquid conduit(s) may be coupled to the outlet aperture from the enclosure with a flange, a pipe nipple, welding, or any other coupling that allows the reservoir liquid to convey from the reservoir to the pump without leaking at the outlet aperture. As indicated below with regard to certain disclosed aspects, the conduit 412 can include two correspondingly configured, matingly engageable (which are engaged in FIG. 3) blind-mate couplers. Such blindly matable "blind-mate" couplers can matingly engage with and disengage from each other without providing direct user or technician access to the couplers. For example, the pump 414 can be positioned adjacent the reservoir 400, placing correspondingly configured, matingly engageable couplers in opposed relationship with each other. As a user urges the pump toward the reservoir, the oppositely positioned blind-mate connectors can urge together and into a matingly engaged relationship with each other. In the matingly engaged relationship, liquid can pass through the couplers without leaking. Similarly, the matingly engaged couplers can be disengaged from each other as the pump is retracted from the reservoir without any material leakage of liquid from the decoupled couplers.

Another aperture, e.g., an aperture 418 at the second end of the conduit 412, may be positioned inside of the reservoir 400. And, instead of extending straight into the reservoir, the liquid conduit 412 may curve or bend such that the aperture 418 is downwardly facing and open toward the bottom 408 of the reservoir.

Liquid flowing through the aperture 418, e.g., being urged by a pressure differential between the free surface 401 and an inlet 416 to the pump, into the conduit 412 will flow upward initially within the conduit, while liquid entering the reservoir 400 from the inlet 402 and flowing from the free-surface 401 to the inlet will flow downward, as shown by the arrows. Such a change in direction of the flow through the reservoir can disrupt and/or delay the onset of a swirling flow or a vortex that may otherwise cavitate or entrain gas from above the free surface 401.

In FIG. 3, the aperture 418 is positioned at an elevation $h_1$ above the floor of the reservoir, defining a gap between the floor of the reservoir and the inlet 418 to the snorkel. The conduit 412 is positioned above the bottom of the reservoir by an elevation $h_2$, which is greater than $h_1$. Stated another way, the outlet aperture 406 through the reservoir wall 410a is positioned above (at a higher elevation than) the aperture 418 of the conduit relative to the floor (as defined by gravity) of the reservoir. The conduit 412 may be positioned through the outlet aperture 406 such that the conduit 412 is oriented perpendicularly or otherwise transversely relative to the side wall 410a. In an embodiment, the conduit 412 may be angled through the outlet aperture 406 such that the conduit 412 slopes up or down with respect to the reservoir.

The aperture 418 to the conduit 412 may have a planar orientation that is parallel to the bottom 408. Alternatively, the orientation of a planar aperture 418 may be angled with respect to the bottom, e.g., not parallel to the bottom. Although a planar aperture is described for succinctness and clarity, the aperture 418 may be non-planar. As well, the aperture may be one of several or many apertures opening to the conduit passageway. Further, additional curves or bends in the conduit 412 may be used to orient the aperture 418 relative to (e.g., to be parallel with or transverse to one of the side walls). Orienting the aperture 418 to face, and be parallel to, an opposite side wall 410b, however, may be less effective than a generally downwardly facing aperture (as in FIG. 3) at inhibiting swirling flows or gas entrainment, particularly if the aperture 418 is positioned relatively far from the inlet or a side wall (e.g., more than a selected number of (e.g., 1, 2, 5, 10) hydraulic diameters of the conduit), as such an orientation would be similar to having the aperture 418 at the reservoir outlet 406. Orienting the aperture 418 to face, and be parallel to, the opposite side wall 410b, at a distance less than a characteristic dimension of a swirling flow, e.g., relatively close to or even behind the inlet relative to the outlet, may tend to disrupt the formation of a swirling flow and thus inhibit entrainment. Such a characteristic dimension may be a selected number of (e.g., 1, 2, 5, 10) hydraulic diameters of the conduit.

The aperture 418 may be angled relative to a longitudinal axis of an entry region to the conduit, for example, if the conduit is cut at an angle rather than perpendicularly as shown in FIG. 3. That is, for a cylindrical conduit, for example, the perimeter of the aperture 418 may be an ellipse rather than a circle when the aperture 418 is angled. For instance, the planar orientation of the aperture 418 may be angled with respect to the bottom 408 and/or the side wall 410a in order to cause the flow of the liquid to change direction sufficiently as it flows from the inlet 402 and into the conduit 412 to inhibit swirl and gas entrainment.

The conduit 412 may be made of a variety of materials suitable for conveying the liquid of the closed-loop system without contaminating the liquid or reacting with the liquid. The liquid may be, for example, a liquid coolant such as, by way of example, distilled water, ethylene glycol, propylene glycol, and mixtures thereof, or oil. The conduit 412 may be rigid, e.g., stainless steel, polyvinylchloride (PVC) pipe, or may be flexible, e.g., silicone or vinyl tubing, and may include a braided sleeve.

The aperture 418 may be funnel-shaped, e.g., wider than a diameter of the conduit 412 at an outer edge and narrowing to the diameter of the conduit 412. The aperture 418 may also be fluted, e.g., have ridges or grooves, which may further direct the liquid flow and inhibit flow separation and cavitation at the aperture.

Accordingly, the shape and positioning of the conduit 412 may inhibit or reduce cavitation. Alternatively, or in addition, the shape and positioning of the conduit 412 may at least move a cavitation zone away from the pump, to the extent that cavitation is not completely inhibited.

Figure 14:
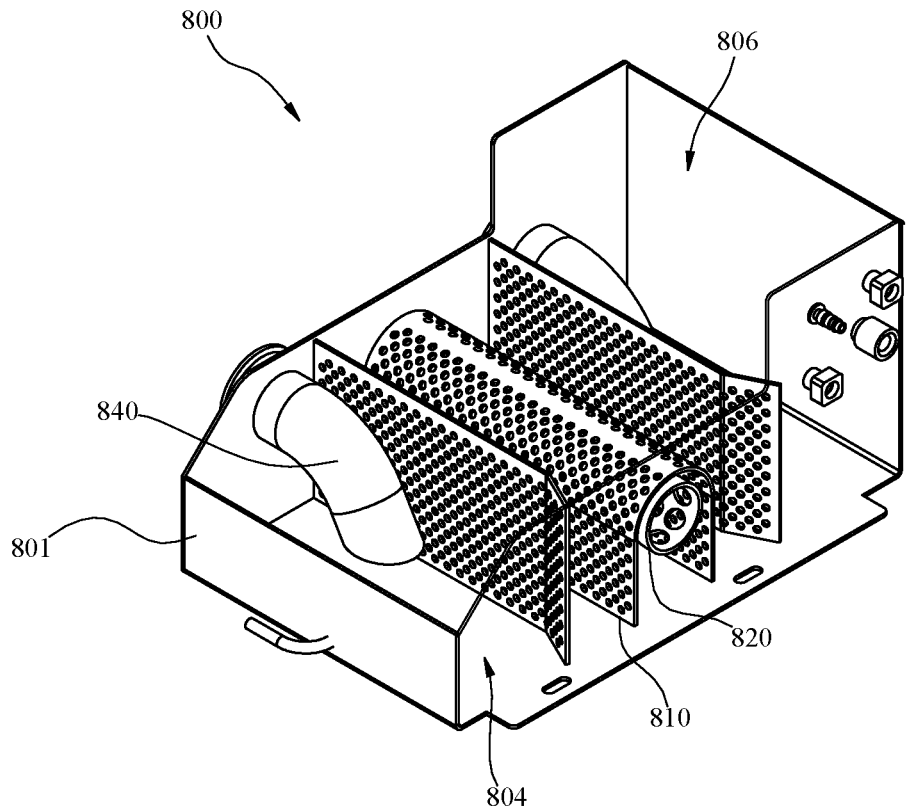
FIG. 14 shows an isometric view of the reservoir shown in FIG. 13 with a cover and a wall removed to reveal internal features of the reservoir.
Figure 15:
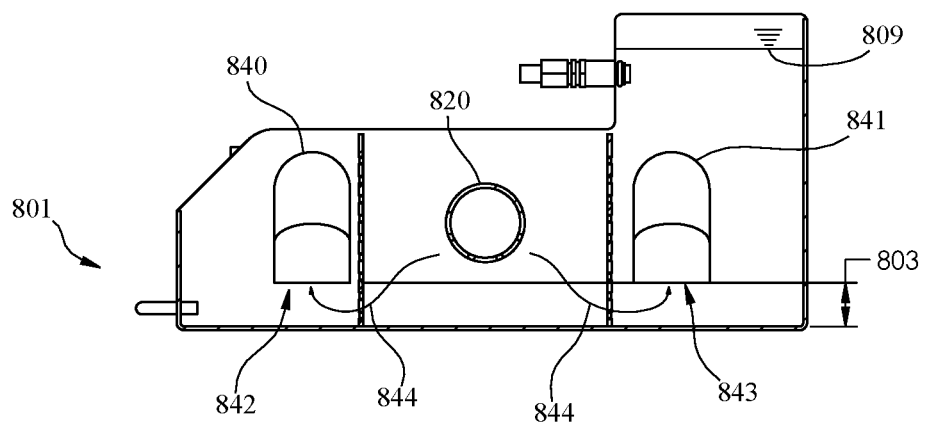
FIG. 15 shows a line drawing of a side-elevation view of the reservoir in FIGS. 13 and 14, with the inlet face removed to reveal internal features of the reservoir.
Figure 16:
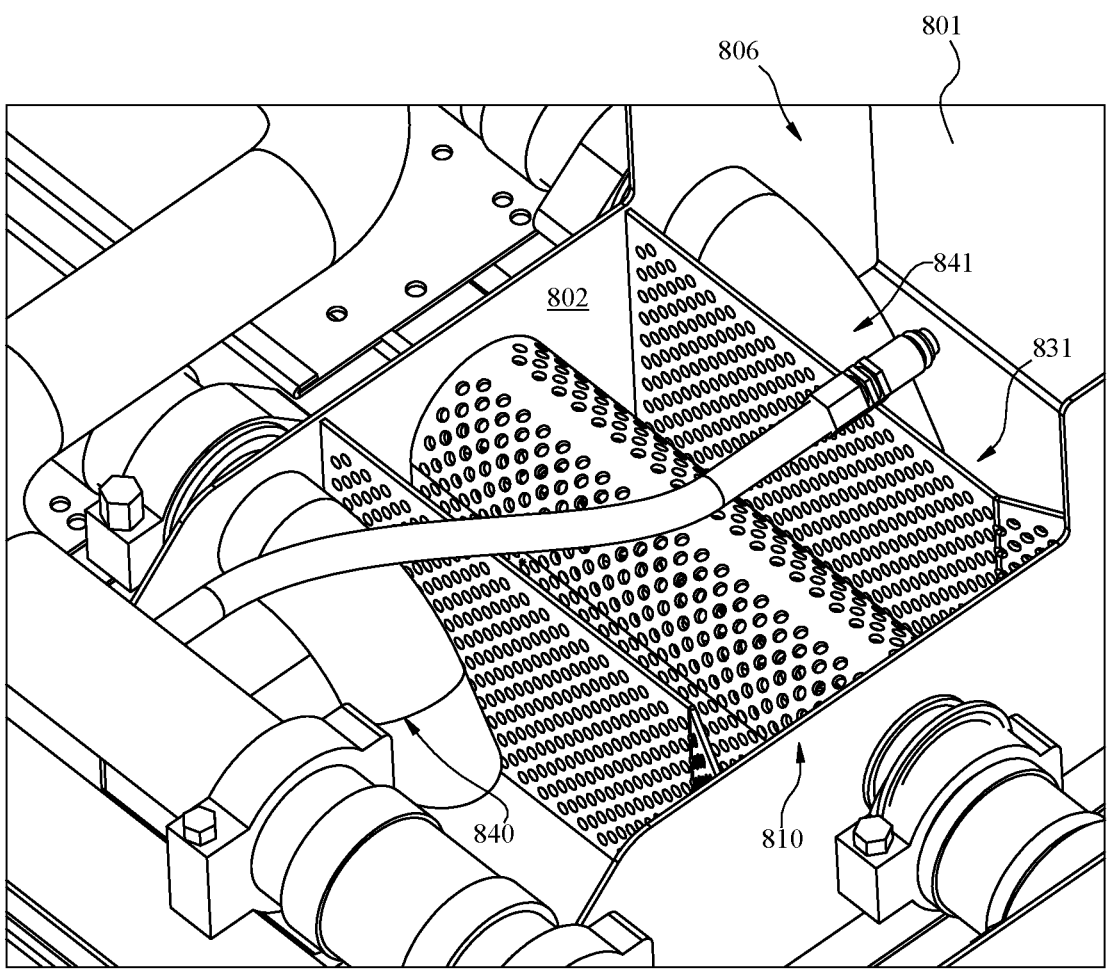
FIG. 16 shows an isometric view of a rendering of a reservoir as in FIG. 14 installed in a liquid pumping unit. A cover of the reservoir in FIG. 16 is removed to reveal internal features of the reservoir.

The use of a perforated baffle (e.g., inlet baffle 810 in FIGS. 13 and 14) may further inhibit entrainment of the gas present in the top of the reservoir, i.e., above the free surface 809 of liquid coolant in the reservoir (FIG. 15). The hydraulic diameter of the apertures (or perforations 812 in FIG. 21) in the baffle 810 may be generally much smaller than the cross-sectional area of the liquid-filled part of the reservoir 800. The small-area apertures through the baffle (e.g., as defined by a wire or other mesh) may disrupt swirling flows having a characteristic dimension on the order of a hydraulic diameter of the snorkel inlet 842, 843, inducing disorganized, small-scale swirling flows and enhancing mixing of the liquid in the reservoir as it flows from the inlet to the outlet.

Referring again to FIGS. 1A through 1D, each liquid pumping unit 100 may be installed on or in the server rack, e.g., generally as depicted. Alternatively, the liquid pumping unit may be a stand-alone liquid pumping unit fluidically coupled with, and physically spaced from (e.g., not mounted to) a plurality of rack mounted servers. In either arrangement, the liquid pumping unit 200 (FIGS. 1C and 1D) may operate to urge the liquid through the various server nodes and other components of any of the cooling systems shown, for example, in FIGS. 1A through 1D.

Referring now to FIGS. 1C and 1D, the control logic 240 can be included within the confines of the liquid pumping unit, as in FIGS. 1C and 1D, or the control logic 240 can be physically separate from the liquid pumping unit. Similarly, the heat exchanger 230 can be included within the confines of the liquid pumping unit or positioned externally of the liquid pumping unit.

In some embodiments, the liquid pumping unit 200, 200' may include valves at the outlet(s) of the reservoir 210. The valves may be one-way valves that allow liquid to leave the reservoir at the outlets, but do not allow liquid to enter the reservoir at the outlets. The liquid pumping unit 200, 200' may also include a valve and a bypass conduit (e.g., a bypass conduit 570 as in FIG. 5) that allows liquid from the pumps to return to the reservoir, for example, when an outlet from the pump is blocked, a condition referred to as a "dead head." A dead-headed pump, if allowed to continue to pump, may heat the liquid trapped within it, eventually damaging the pump. If flow from the liquid pumping unit is blocked, for example, a valve along the bypass loop may be opened to allow the liquid from the pumps to return to the reservoir.

III. Reservoir-and-Pump Units

Figure 4:
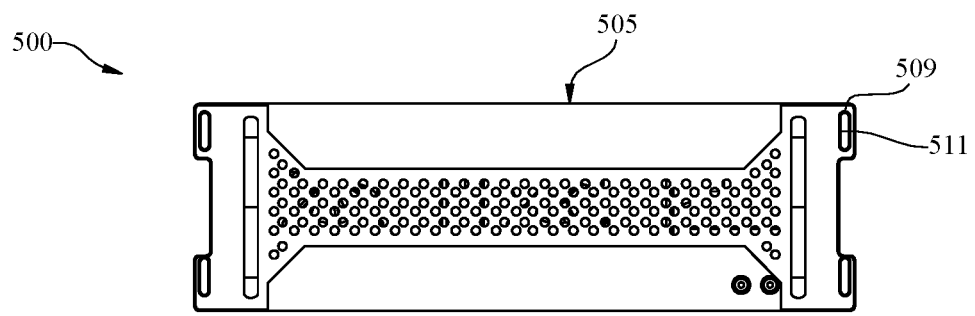
FIG. 4 shows a front panel for a liquid pumping unit configured to mount within a server rack.

FIG. 4 shows a front panel of a liquid pumping unit 500 that can be mounted in a server rack of the type generally shown in FIGS. 1A through 1D. FIG. 4 shows a mounting flange 509 extending laterally of a major surface of the liquid pumping unit's 500 front panel 505. The mounting flange 509 defines an aperture or a slot 511 having a position that corresponds with a mounting feature (not shown) on the rack. A fastener can extend through the aperture or slot and engage the server rack.

Figure 5:
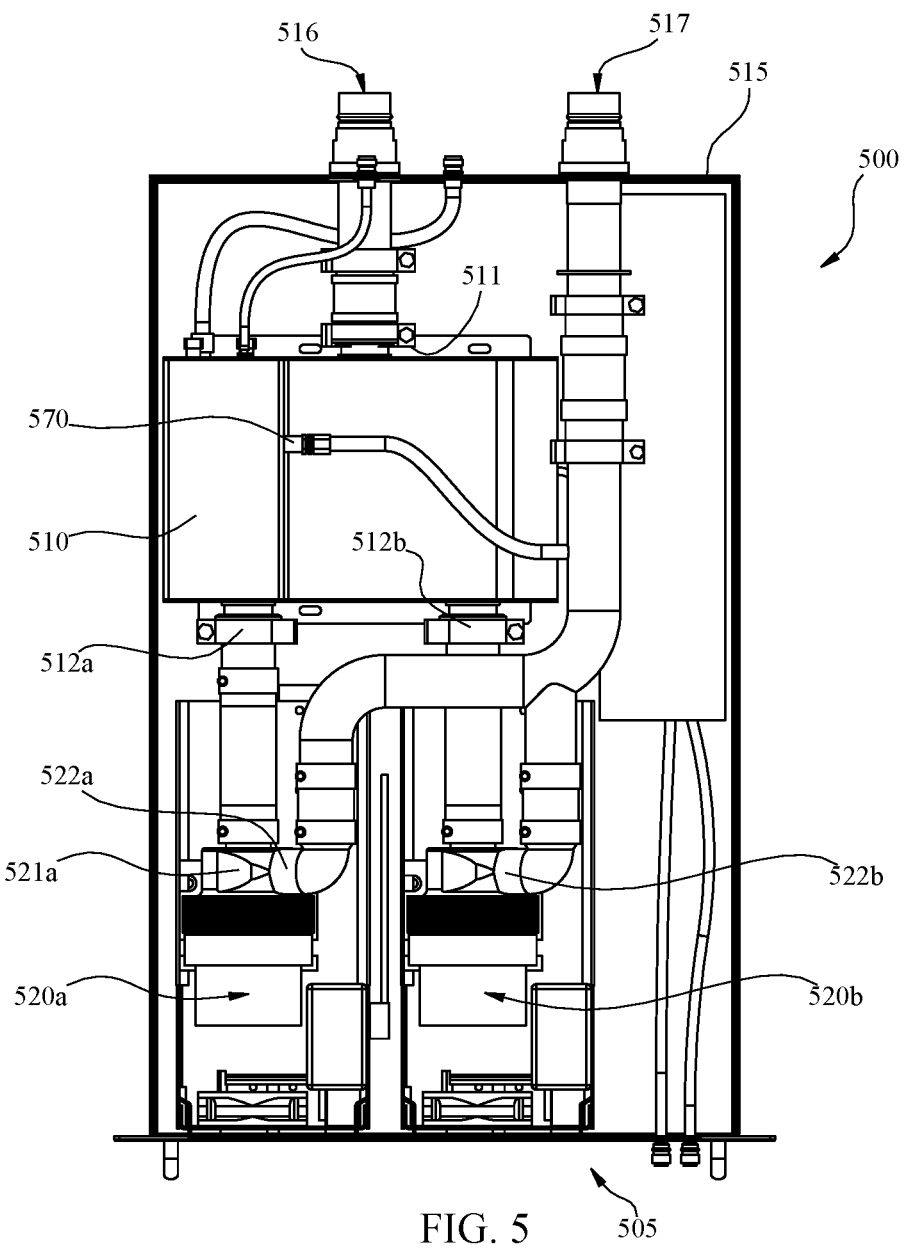
FIG. 5 shows a top view of a liquid pumping unit as in FIG. 4 with a cover removed to reveal internal features of the liquid pumping unit.

In FIG. 5, a cover of the liquid pumping unit is removed to reveal internal features of the liquid pumping unit 500. The liquid pumping unit 500 has a reservoir 510 and two pumps 520a, 520b that are fluidically coupled with each other in parallel. The liquid pumping unit 500 also defines a rear panel 515 having an inlet 516 and an outlet 517. The inlet 516 is fluidically coupled with an inlet 511 to the reservoir 510 and the outlet 517 is fluidly coupled with an outlet 522a, 522b of each pump 520a, 520b. Several other features of the liquid pumping unit are shown and labeled in FIG. 5.

Figure 6:
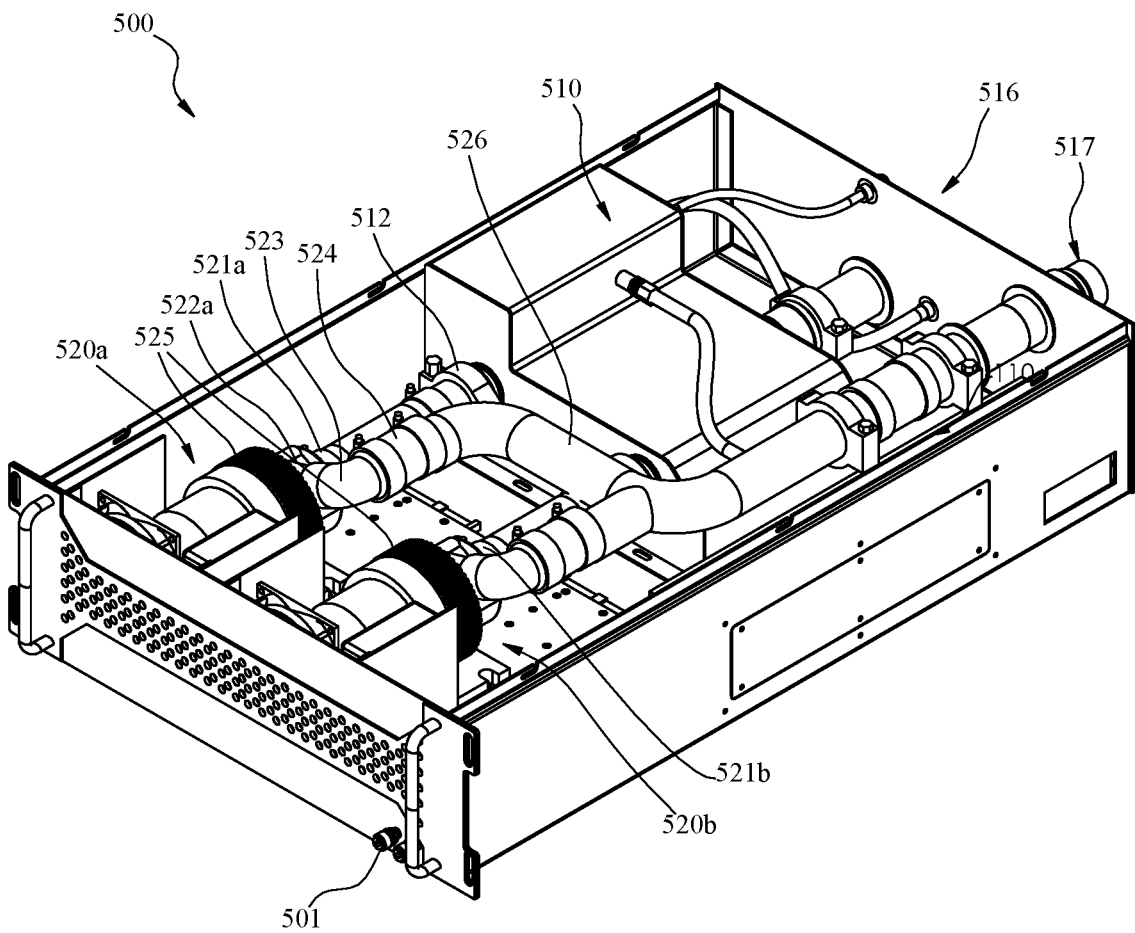
FIG. 6 shows an isometric view of a liquid pumping unit as in FIG. 4 with a cover removed to reveal internal features of the liquid pumping unit.

As shown by the isometric view in FIG. 6, a fluid coupler 512a, 512b between the reservoir 510 and each pump inlet 521a, 521b can couple the pump inlet with the reservoir, allowing each pump 520a, 520b to draw liquid from the reservoir into the pump volute 525. An impeller (not shown) driven by the pump motor can perform work on the liquid and increase a pressure head in the liquid at the outlet 522a, 522b from the volute. In FIG. 6, the outlet bend 523 (outlet bend 923 in FIG. 24) is integrally formed with the pump volute. That is to say, a unitary housing defines the pump volute, the outlet 522a from the pump volute, and the outlet bend 523. An outlet extension 524 couples the outlet bend 523 with internal piping 526 that carries the liquid to outlet 517 of the liquid pumping unit 500. FIG. 6 also depicts fill and drain ports 501 extending through the front panel of the liquid pumping unit 500.

Figure 7:
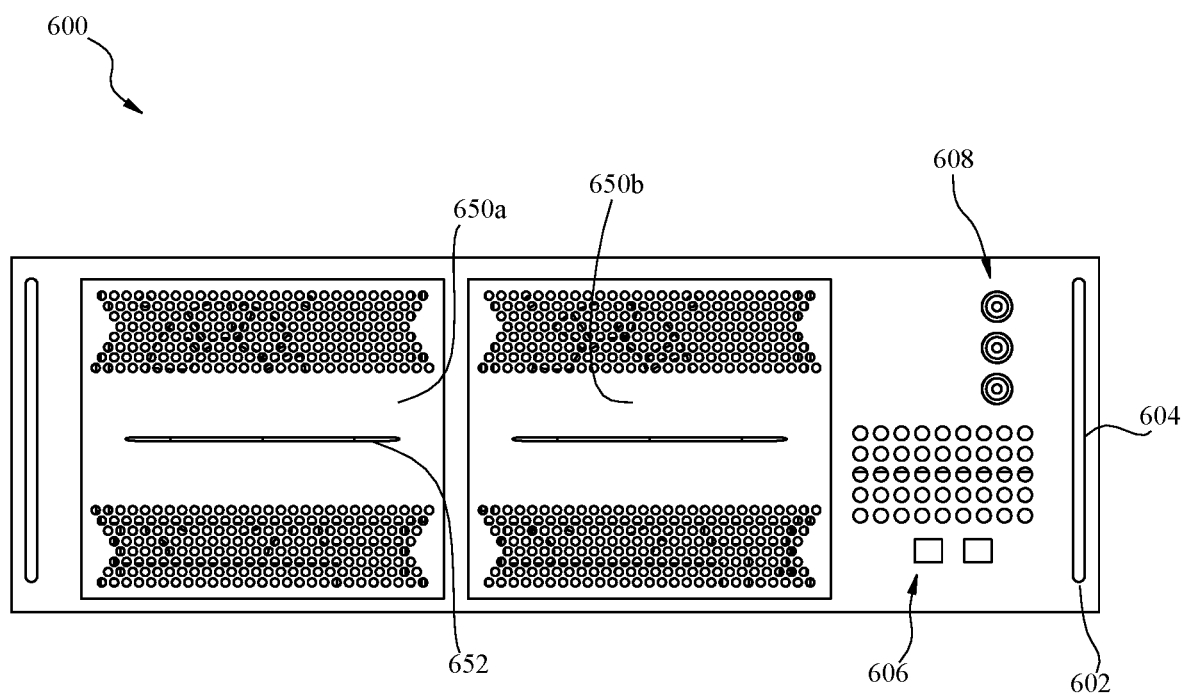
FIG. 7 shows a front panel for a liquid pumping unit configured to mount within a server rack. The liquid pumping unit in FIG. 7 includes two removable pump trays to permit installation and removal of a pump while the liquid pumping unit remains installed in the rack.

In FIG. 7, another front panel of a liquid pumping unit 600 is shown. As in FIG. 4, the front panel in FIG. 7 has opposed mounting flanges 602 defining corresponding slots 604 that a fastener can extend through to mount the liquid pumping unit in a standard rack. However, the front panel in FIG. 7 can accommodate pump trays 650a, 650b that can be removed from the liquid pumping unit 600 while the liquid pumping unit remains mounted in the server rack. Such arrangements are described more fully below. In FIG. 7, communication connections 606 and coolant connections 608 are shown. As well, a user-graspable handle 652 is shown on each pump tray 650a, 650b.

Figure 8:
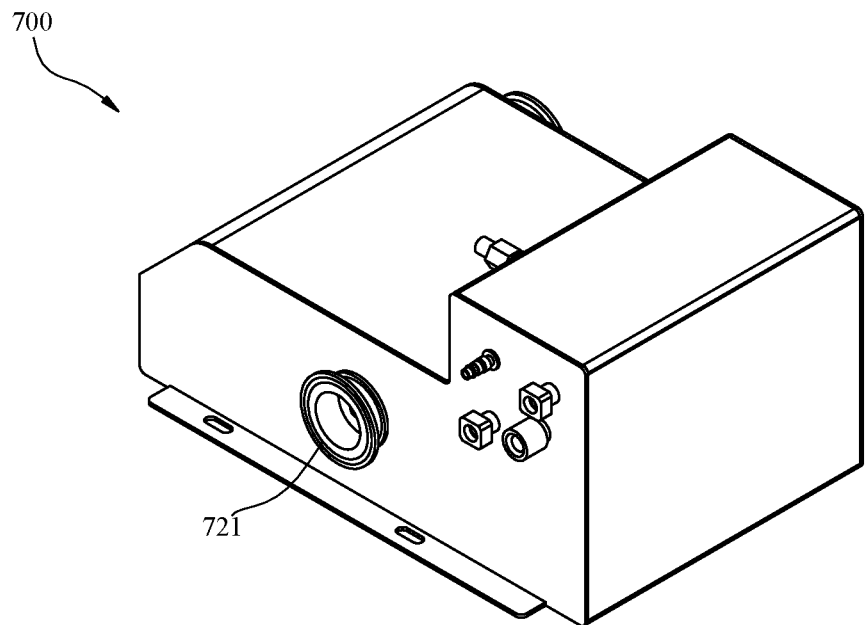
FIG. 8 shows an isometric view of a reservoir suitable for use within a liquid pumping unit as described herein, with an inlet face visible.
Figure 9:
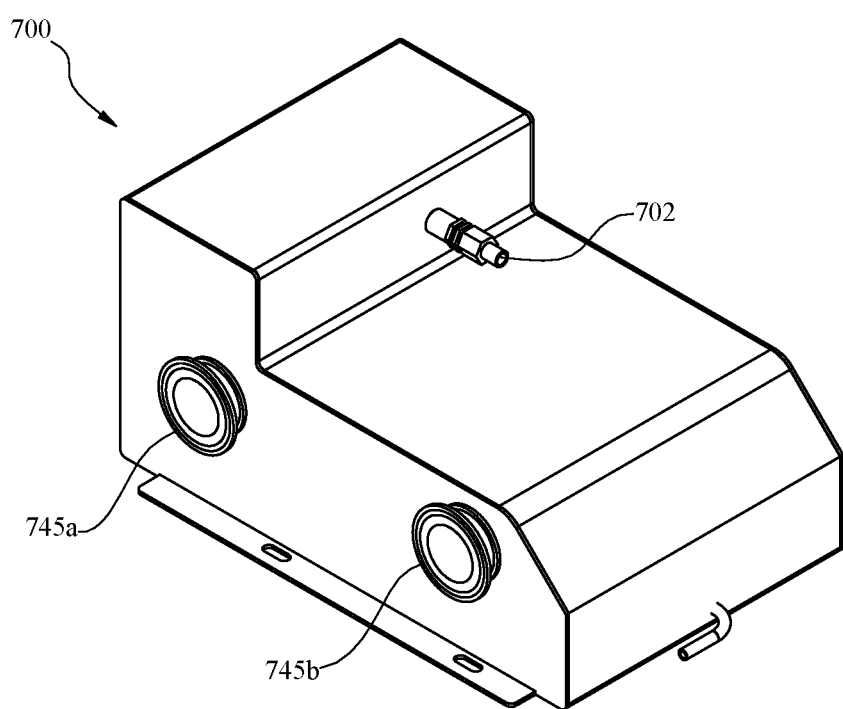
FIG. 9 shows an isometric view of the reservoir in FIG. 8 with an outlet face visible.
Figure 10:
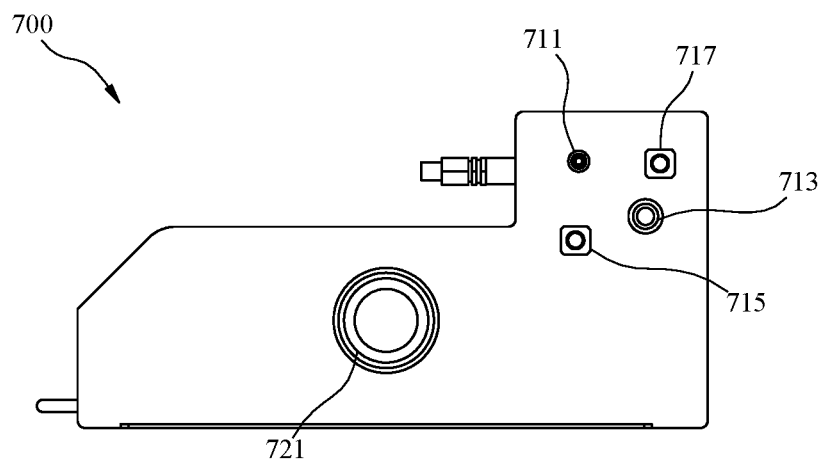
FIG. 10 shows a side-elevation view of the inlet face of the reservoir in FIG. 8.
Figure 11:
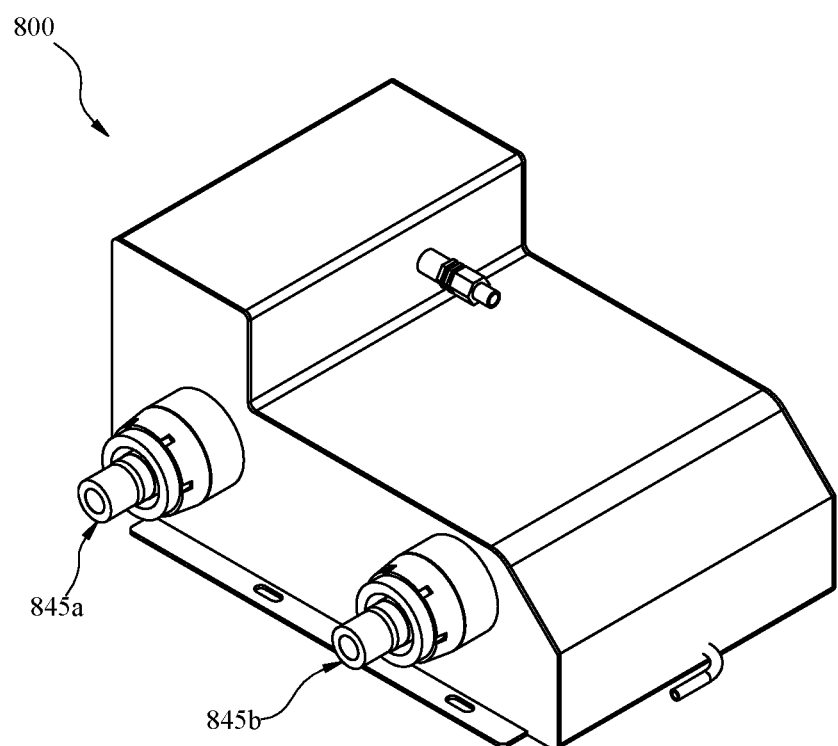
FIG. 11 shows an isometric view of a reservoir suitable for use within a liquid pumping unit as described herein, with an outlet face visible.
Figure 12:
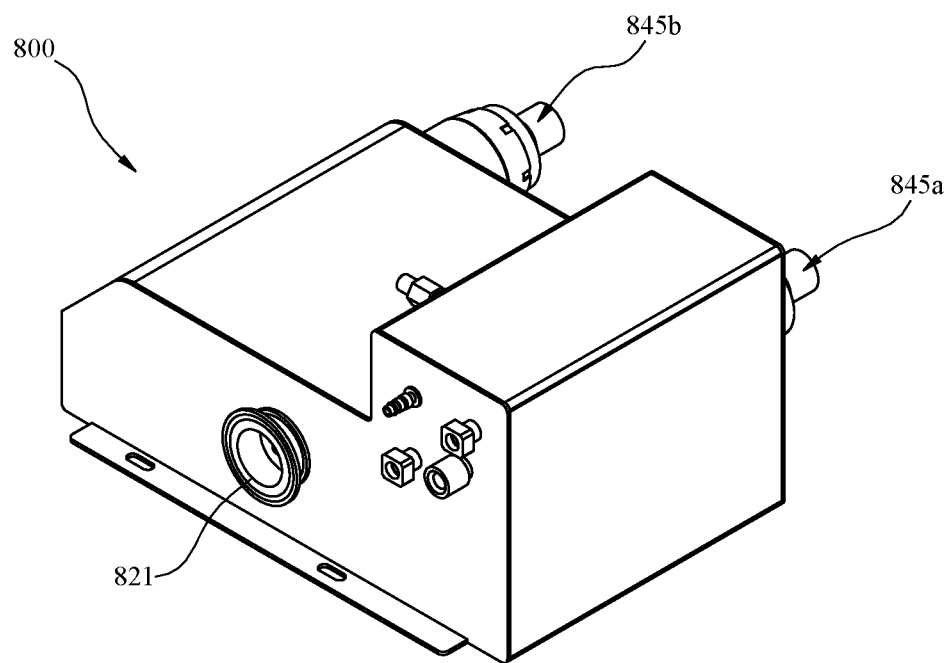
FIG. 12 shows an isometric view of the reservoir in FIG. 11 with an inlet face visible.

FIGS. 8 through 17 show aspects of reservoirs generally as described above. In FIG. 8, the reservoir 700 defines an inlet face having an inlet port 721. In FIG. 9, the reservoir 700 defines an outlet face having a first outlet port 745a and a second outlet port 745b, each of which can optionally include a swing valve. As FIG. 10 shows, the inlet face of the reservoir 700 can have a vent port 711, a check valve 713 and an upper level sensor 715 and a lower level sensor 717. Alternatively, as shown in FIGS. 11 and 12, a reservoir 800 can a blind-mate coupler for each outlet port 845a, 845b. In FIG. 9, the reservoir also has an over-pressure check valve 702, or vent, configured to release excess water or gas (e.g., air) if the internal pressure in the reservoir exceeds a threshold pressure.

Figure 13:
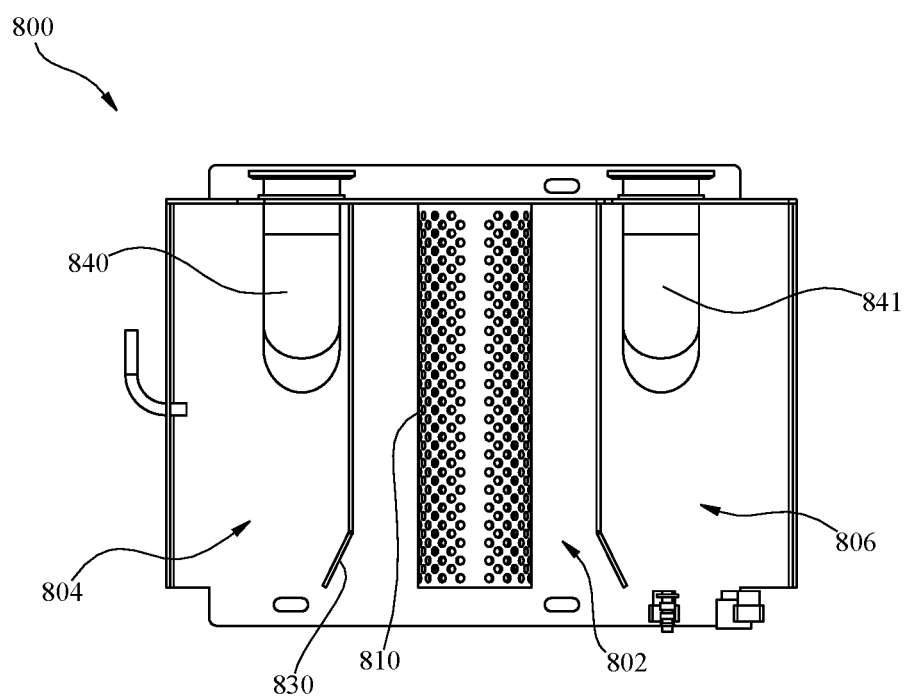
FIG. 13 shows a plan view from above a reservoir, with a cover removed to reveal internal features of the reservoir.
Figure 18:
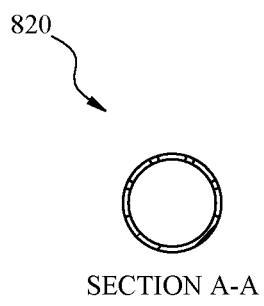
FIG. 18 shows an end-elevation view of an inlet manifold of the type shown in FIG. 17.
Figure 19:
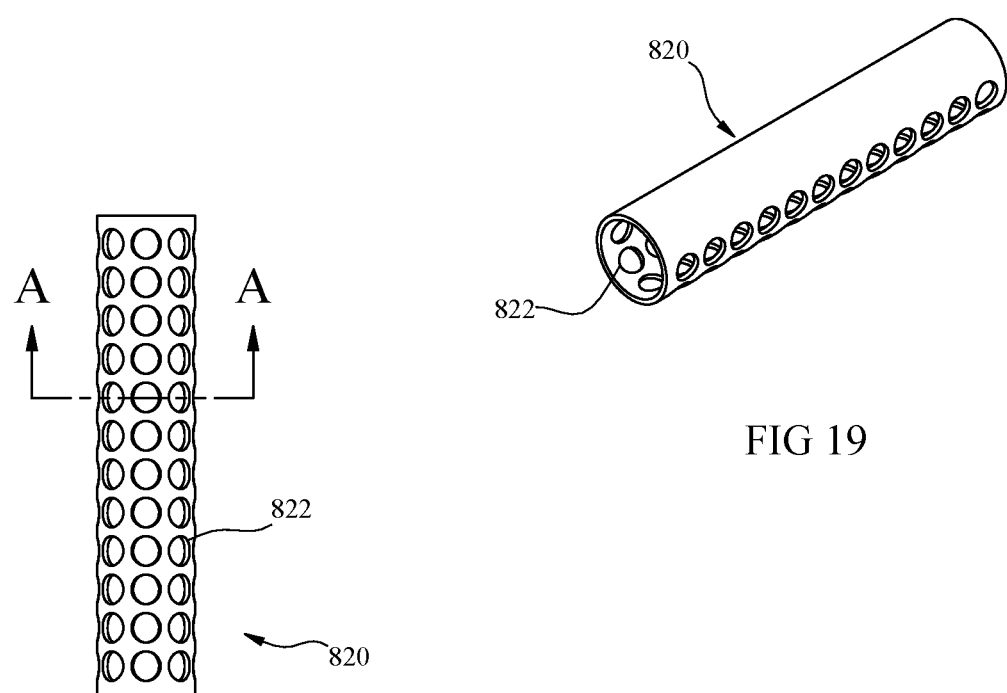
FIG. 19 shows an isometric view of the inlet manifold shown in FIG. 18.
Figure 20:
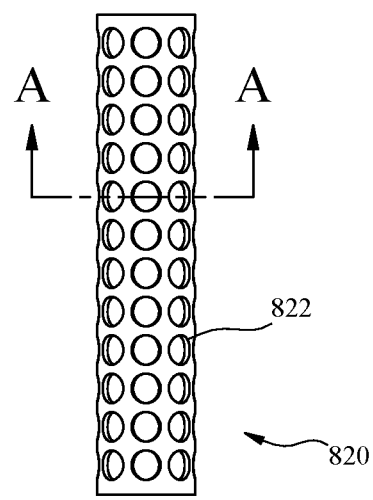
FIG. 20 shows a plan view of the inlet manifold shown in FIGS. 17 and 18.
Figure 21:
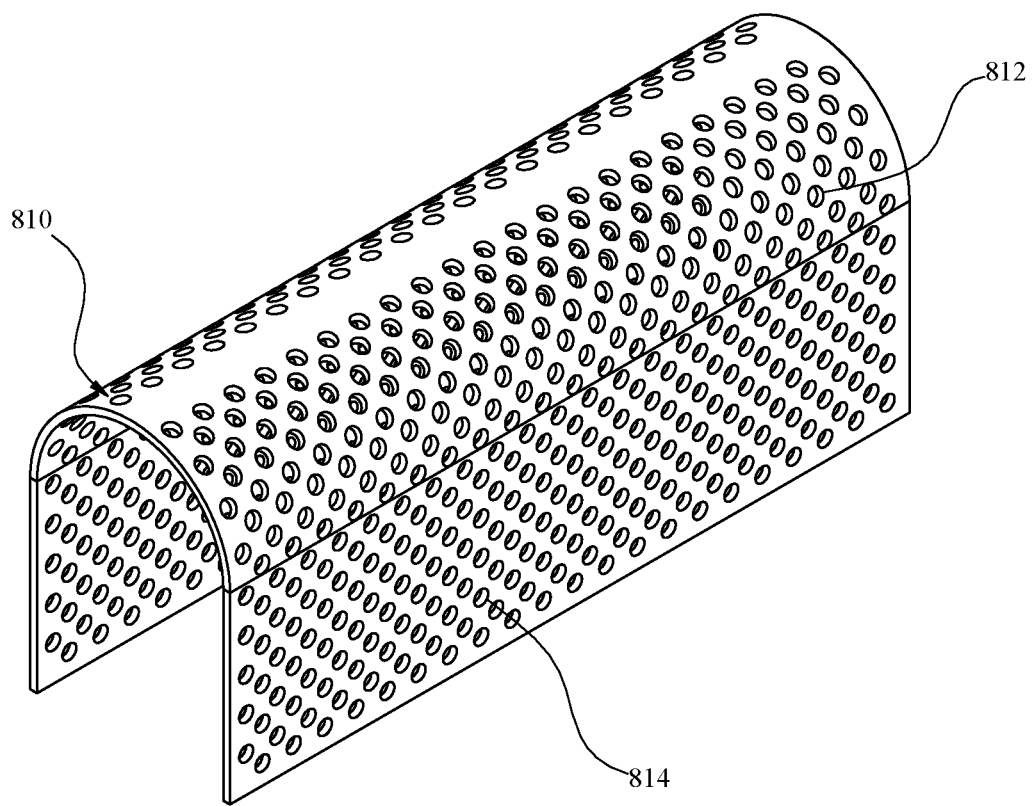
FIG. 21 shows a top view of a baffle wall of the type shown in the reservoir in FIG. 16.
Figure 22:
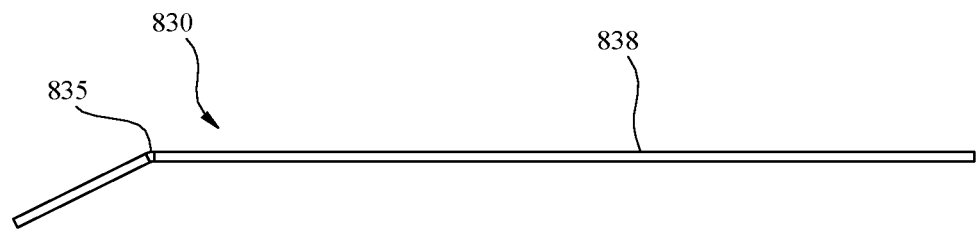
FIG. 22 shows a top view of a baffle wall of the type shown in the reservoir in FIG. 16.
Figure 23:
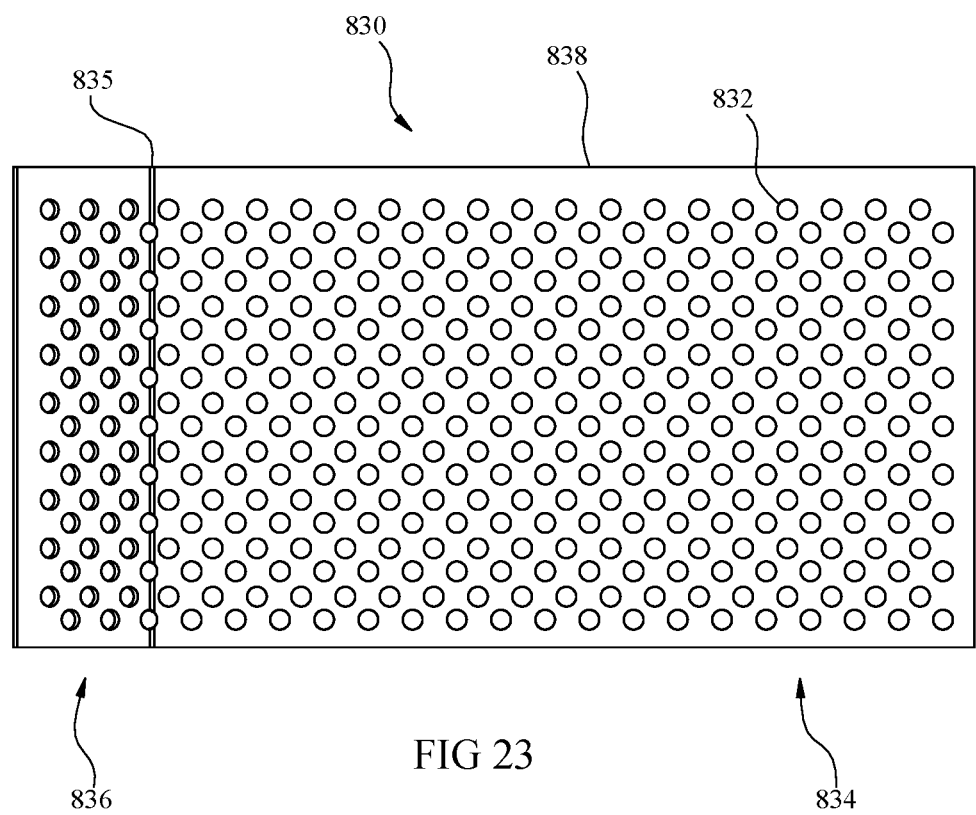
FIG. 23 shows a side-elevation view of the baffle wall shown in FIG. 22.

In FIGS. 13 and 14, a horse-shoe-shaped inlet baffle 810 (see FIG. 21) is positioned over a perforated inlet manifold 820 (FIGS. 18-20) having a plurality of distribution ports 822. The inlet manifold 820 receives coolant from the inlet port 821 (FIG. 8). The inlet baffle 810 is bent into a horse-shoe shape having opposed walls 814 (FIG. 21). Further opposing baffle walls 830, 831 (FIGS. 23 and 24) are positioned between the inlet manifold 820/baffle 810 and corresponding snorkels 840, 841, dividing the reservoir 800 into separate functional chambers: (1) an inlet chamber 802 positioned between the opposed baffle walls 830, 831; and (2) opposing pump plenums 804, 806 positioned outward of and flanking the inlet chamber 802. The arrows 844 depict generally a flow path extending from the inlet manifold to the inlets 842, 843 of the snorkels. Each pump plenum 804, 806 is separated from the inlet chamber 802 by a corresponding baffle wall 830, 831. Each baffle wall 830, 831 defines a respective perforated region having a plurality of perforations 832 spanning a main segment 834 and a bent segment 836, as shown in FIGS. 22 and 23. The bent segment 836 is continuous with and distinguished from the main segment 834 by a bend 835. A perimeter edge 838 of the baffle 830 abuts or is placed in close proximity to the reservoir housing 801, as shown in, for example, FIG. 17.

Figure 17:
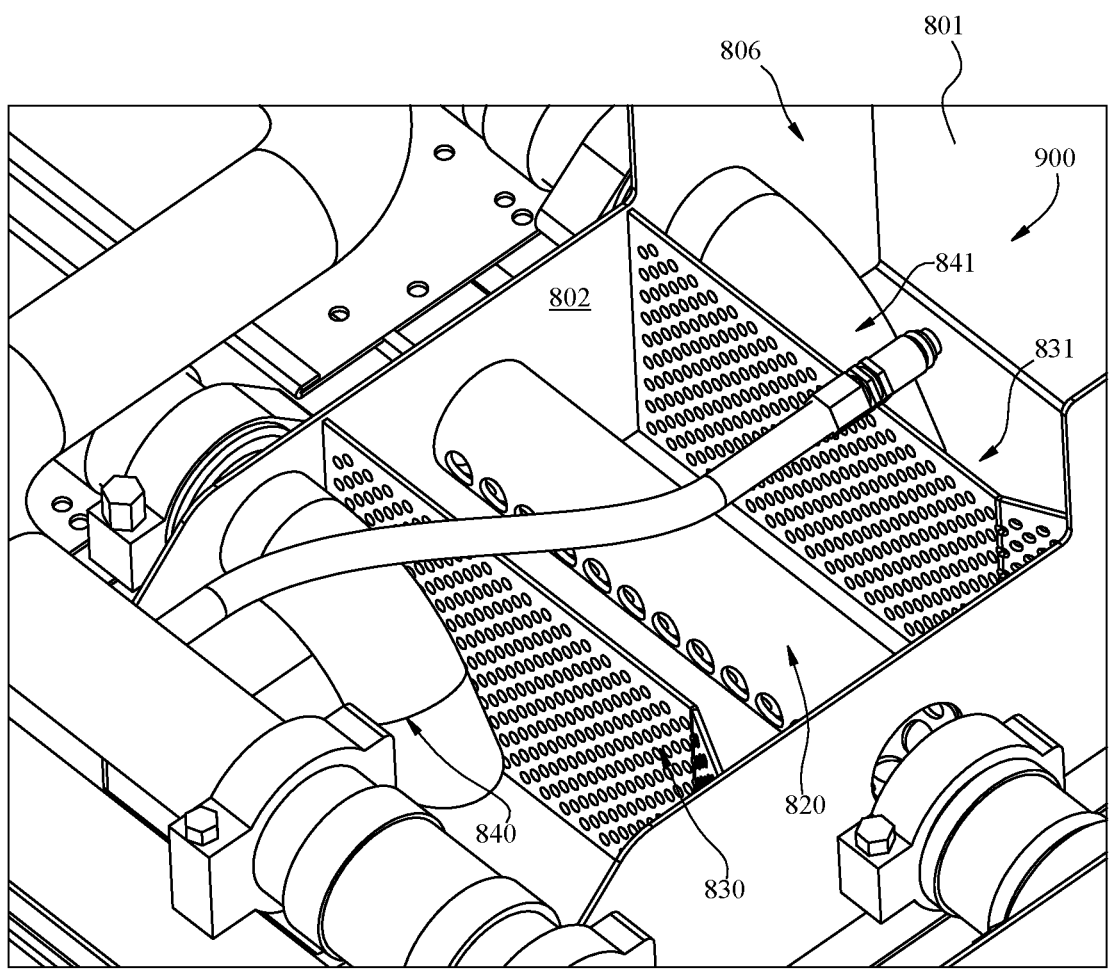
FIG. 17 shows another isometric view of the reservoir as in FIG. 16, zoomed out to reveal more internal features of the liquid pumping unit and reservoir.

The inlet manifold 820 (FIGS. 18 through 20) and the corresponding inlet baffle 810 (FIG. 21) are positioned within the inlet chamber 802. As shown in FIGS. 15 and 17, and described above in connection with FIG. 3, a gap 803 between the snorkel inlets 842, 843 and the floor 805 of the reservoir 800 allow liquid to flow from the respective pump plenum 804, 806 into the corresponding snorkel inlet 842, 843. The arrangement of baffles can inhibit or altogether eliminate formation of vortices having a characteristic length scale on the same order as a cross-sectional dimension of the snorkels 840, 841 or the inlet manifold 820. Consequently, the baffles 830, 831 can inhibit or altogether eliminate entrainment of gas (and thus "foaming" of coolant) within the reservoir 800.

Figure 24:
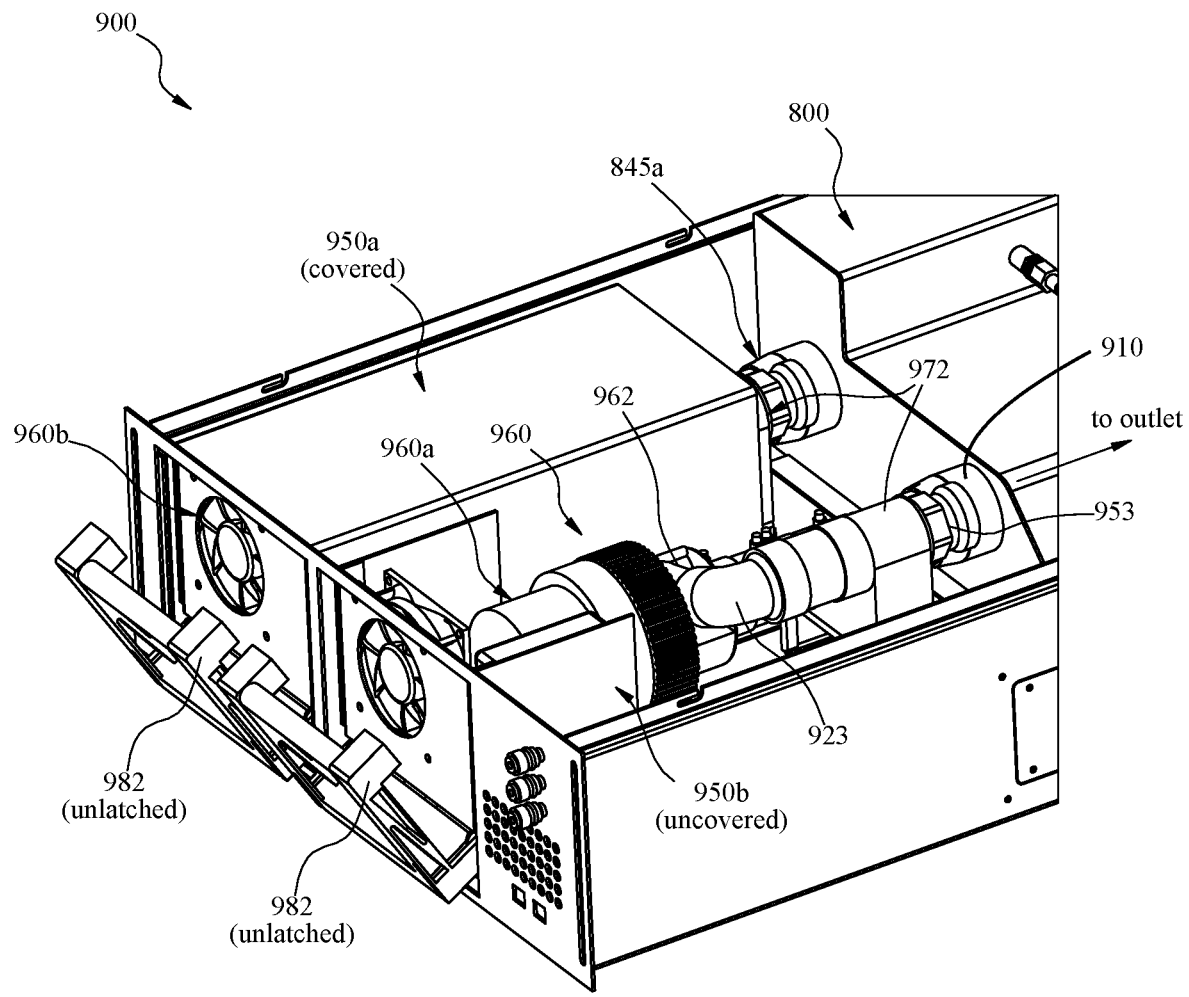
FIG. 24 shows an isometric view of a liquid pumping unit as in FIG. 17.
Figure 25:
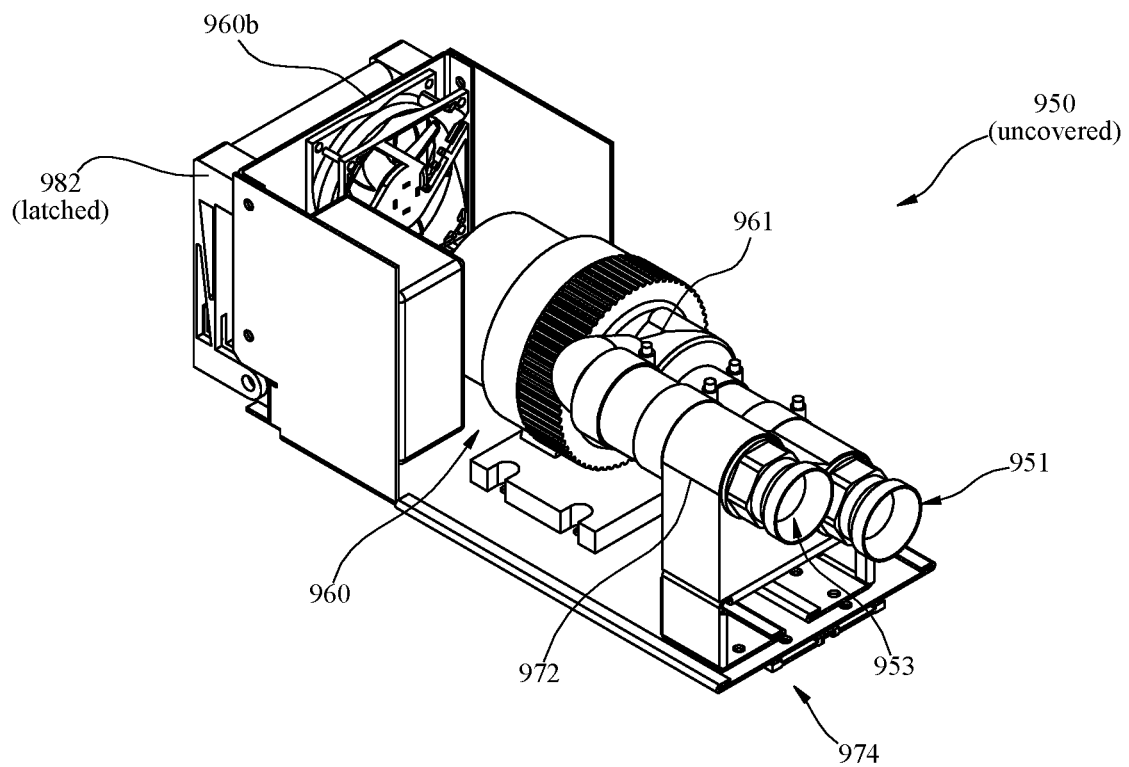
FIG. 25 shows an isometric view of a pump tray as in FIG. 24, with a cover removed.
Figure 26:
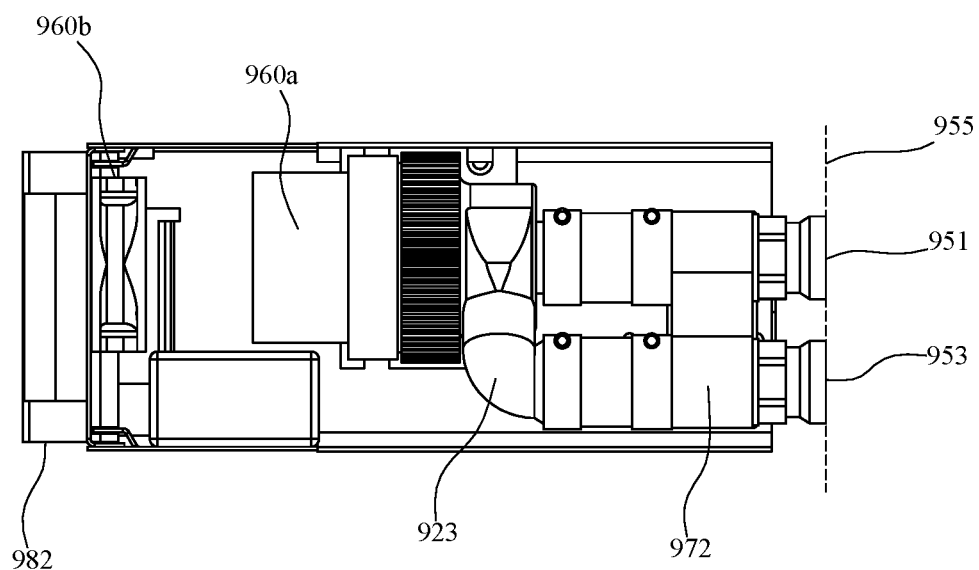
FIG. 26 shows a plan view from above the pump tray shown in FIG. 25.
Figure 27:
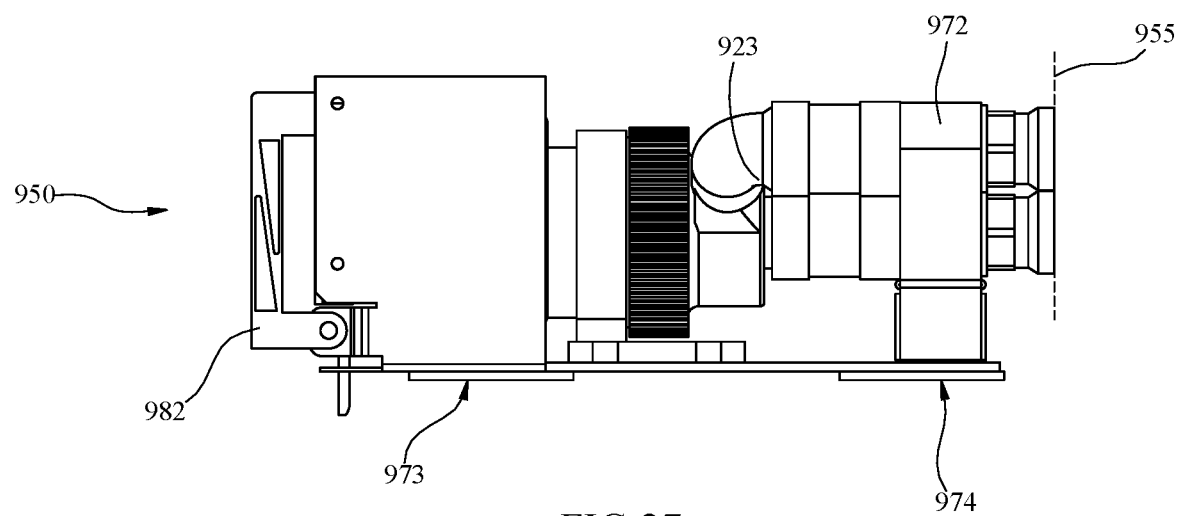
FIG. 27 shows a side-elevation view of the pump tray shown in FIG. 25.
Figure 28:
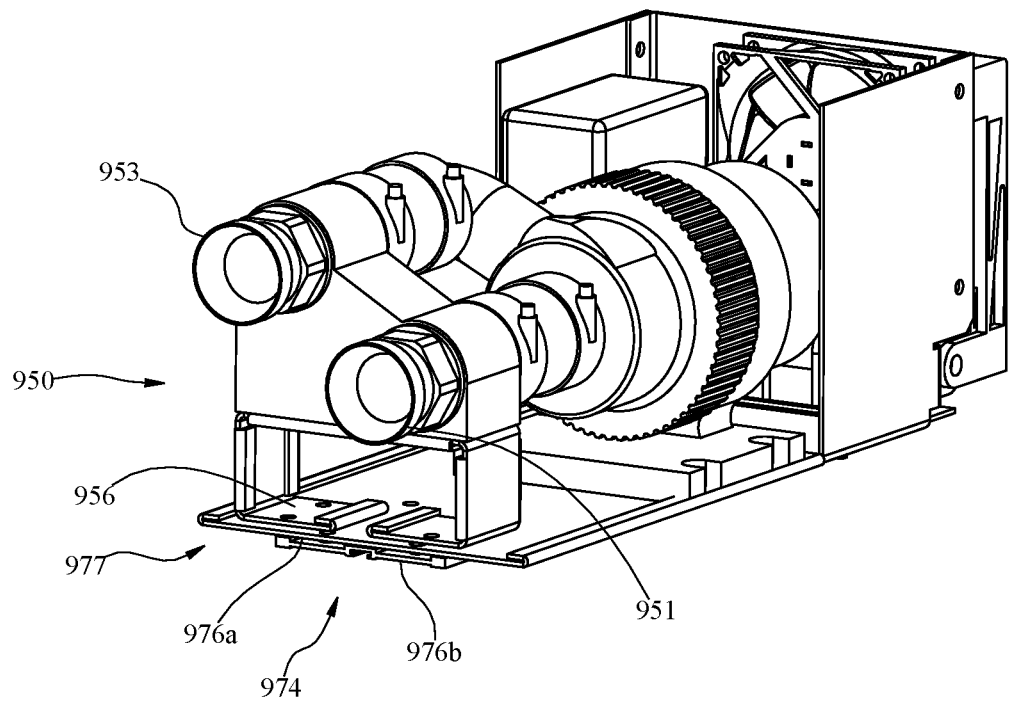
FIG. 28 shows another isometric view of the pump tray shown in FIG. 25, with a liquid-connection face of the pump tray shown. The liquid-connection face of the pump tray couples with a face of the reservoir in opposed relation to the reservoir (FIG. 24).
Figure 29:
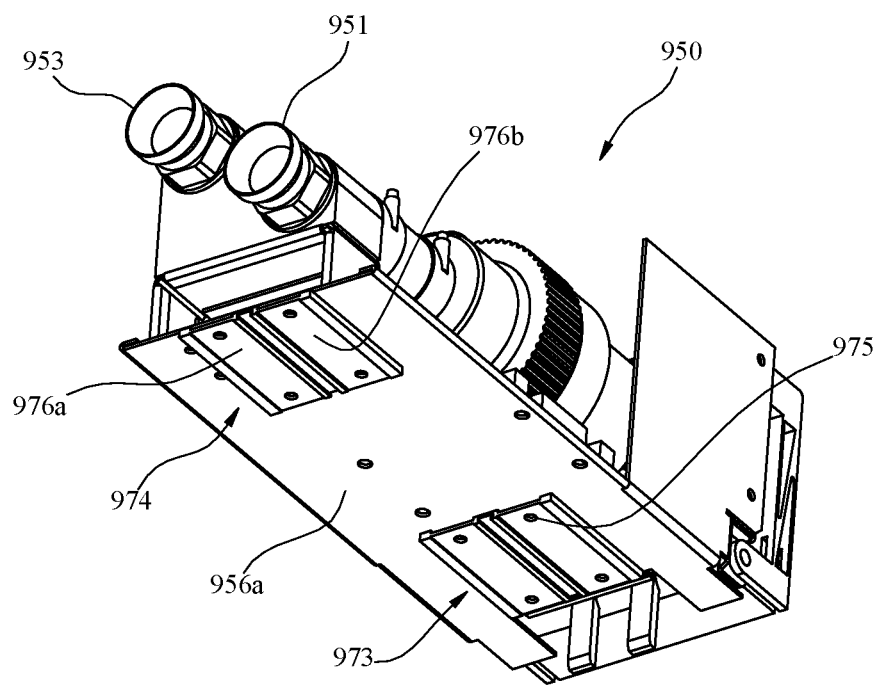
FIG. 29 shows an isometric view from below of the pump tray shown in FIG. 28.
Figure 30:
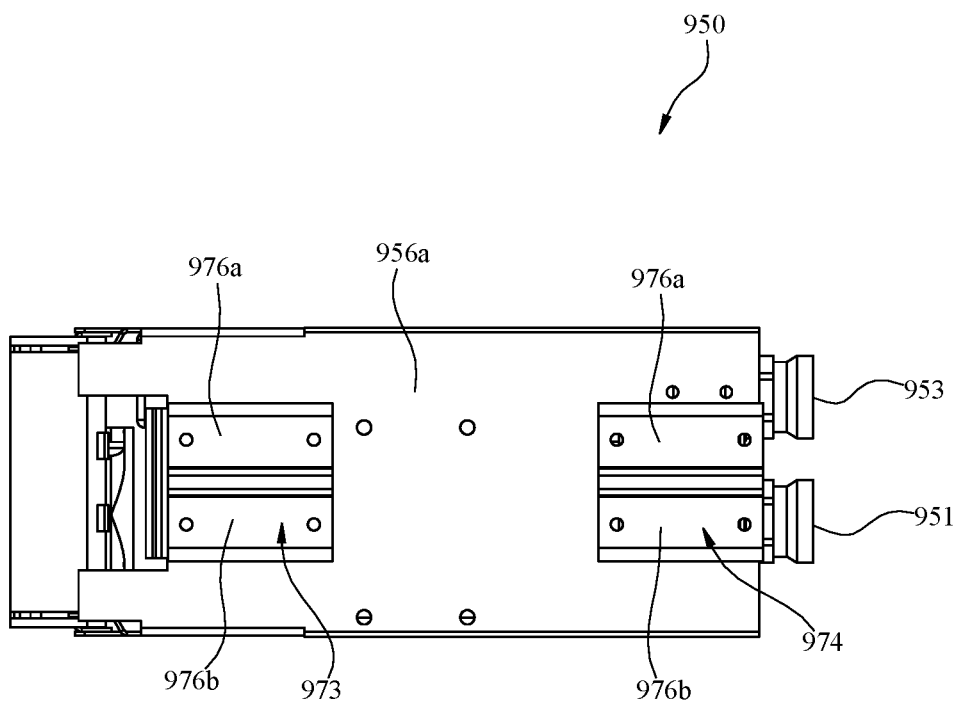
FIG. 30 shows a plan view from below the pump tray shown in FIG. 28.

The isometric view in FIG. 24 reveals a portion of a liquid pumping unit 900 having a flow path generally as described above in connection with FIGS. 5 though 24. In FIG. 24, however, the pumps 960 and the reservoir 800 (as in FIG. 11) are configured to permit each pump 960 to be removed from or inserted into the liquid pumping unit 900 while the liquid pumping unit continues to urge coolant through the liquid pumping unit and the corresponding liquid-cooling system (e.g., as in FIGS. 1A through 1D). For example, the reservoir 800 in FIG. 24 (and FIG. 11) incorporates a blindly matable and blindly disengeable liquid coupler 845a, 845b corresponding to each pump inlet. Similarly, as shown in FIGS. 26-28, each pump tray 950 (e.g., pump trays 950a, 950b in FIG. 24) has a corresponding inlet port. The inlet port to each pump tray 950 is defined by a blindly matable and blindly disengeable liquid coupler 951 having a complementary configuration relative to the corresponding blindly matable and blindly disengeable liquid coupler 845 on the reservoir 800. Moreover, the blindly matable and blindly disengeable liquid coupler 951 on each pump tray 950 has an orientation and a position corresponding to the respective liquid coupler 845 of the reservoir 800. Consequently, as a pump tray 950 is inserted into the liquid pumping unit 900, the complementarily configured blind-mate coupler 951 of the pump tray 950 urges into contact with and matingly engages with the corresponding blind-mate coupler 845 of the reservoir 800, fluidicly coupling the respective pump inlet 951 with a chamber 804, 806 in the reservoir 800.

Moreover, the liquid pumping unit 900 has outlet piping that fluidly can couple an outlet 962 (FIG. 24) from the volute 961 of the pump 960 with an outlet from the liquid pumping unit 900 (see FIGS. 5 and 6, e.g., outlet 517 in FIG. 6). A pump motor 960a can be cooled by a fan 960b. The internal piping of the liquid pumping unit 900 shown in FIG. 24 also has a blind-mate coupler 910 configured to matingly engage with a corresponding blind-mate coupler 953 on the outlet flow path from the pump 960. As shown in FIGS. 27 and 28, the blind-mate coupler 951 for the inlet to the pump tray 950 and the blind-mate coupler 953 for the outlet from the pump tray can be positioned in a common plane 955. Nonetheless, the blind-mate couplers 951, 953 need not be positioned in a common plane, so long as each blind-mate coupler on the pump tray 950 is positioned in correspondence with a counterpart blind-mate coupler 845,910 in the liquid pumping unit 900 when the pump tray is inserted in the liquid pumping unit.

Referring now to FIGS. 26 through 31, the pump tray 950 has a chassis (or frame) to which components of the pump tray are mounted. For example, the chassis has a block 972 configured to retain the inlet port and the outlet port, inhibiting movement of the associated blind-mate couplers 951, 953, respectively, during insertion and removal of the pump tray 950 relative to the liquid pumping unit 900 and maintaining suitable alignment of those blind-mate couplers with the corresponding blind-mate couplers 845, 910 on the reservoir 800 and internal piping of the liquid pumping unit.

In addition to the block 972 that retains alignment of the blind-mate couplers (liquid couplers 951, 953, electrical connector(s) 956, or both) relative to the pump tray 950, the pump tray also has a rail foot 973, 974 configured to slidably engage with a correspondingly configured rail 920 in the liquid pumping unit 900. The rail foot 973, 974 is configured to maintain alignment of the pump tray 950 in relation to the rail 920 in the liquid pumping unit, and thus maintain alignment of the pump tray 950 relative to the liquid pumping unit 900. Although there are many possible configurations of alignment features that will permit one device (e.g., a pump tray 950) to remain aligned with another device (e.g., the liquid pumping unit 900) as the one device moves (e.g., translates, or slides) relative to the other device, one particular illustrative arrangement is now described.

The pump tray shown in FIG. 27 has a pair of rail feet 973, 974 longitudinally spaced apart from each other along a longitudinal axis (not shown) of the pump tray 950. Each rail foot 973, 974 defines a central channel (or slot) 975 having a corresponding longitudinal axis (not shown) aligned generally parallel to the longitudinal exist of the pump tray 950. Extending outwardly of the central channel, each rail foot 973, 974 defines a corresponding pair of opposed flanges 976a, 976b flanking the central channel 975. Each flange 976a, 976b also defines an outer edge extending substantially parallel with the central channel 975. Although not shown, the outer edges or a segment of each outer edge can be inwardly tapered toward the central channel 975 to facilitate alignment in the corresponding rail 920 of the liquid pumping unit 900. Additionally or alternatively, each leading edge of the rail flange 925 (FIG. 31) can be tapered or cut-out to facilitate user alignment. For example, the taper can extend longitudinally along the rail 920 in one or more planes. Each flange 976a, 976b can be spaced from the external surface 956a of the floor 956 of the pump tray 950 outward of and in a direction perpendicular to the longitudinal axis of the central channel 975, defining a gap 977 between the flange 976a, 976b and the floor of the pump tray.

Figure 31:
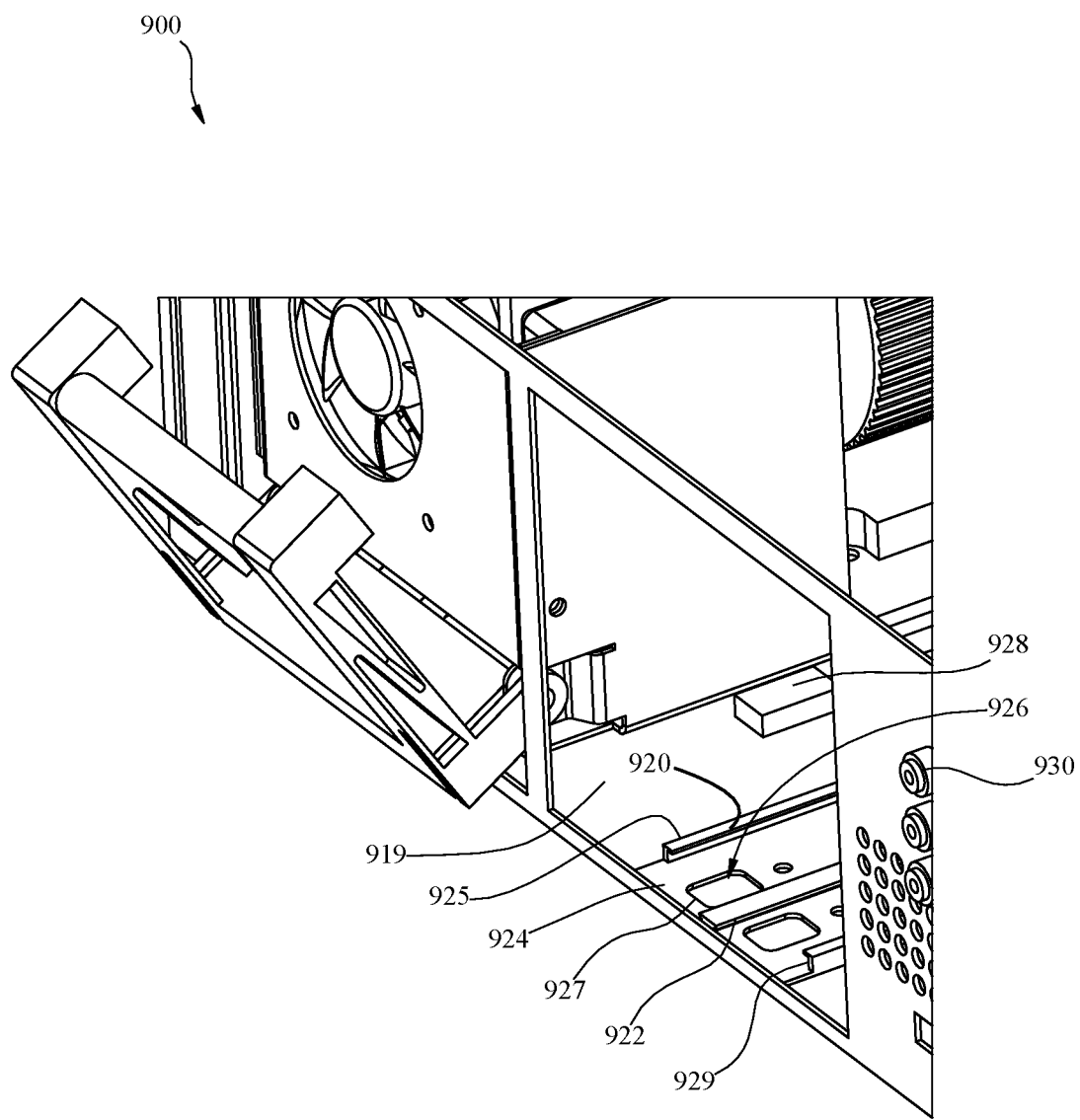
FIG. 31 shows an isometric view showing the front face of the liquid pumping unit shown in FIG. 24, with one of the pump trays removed and the pump-tray door of the other pump tray unlatched.

Referring now to FIG. 31, a corresponding rail 920 of the liquid pumping unit 900 is described. The rail 920 of the liquid pumping unit 900 defines a raised and centrally positioned guide rail 922 that extends longitudinally inward from a front face of the liquid pumping unit. When the pump tray 950 is positioned in the liquid pumping unit 900, the central channel 975 of each rail foot 976a, 976b straddles and slides along the central guide rail of the liquid pumping unit. A pair of rail floors 924 extend laterally outward of the raised guide rail 922 and extend longitudinally along the rail 920 of the liquid pumping unit 900. When the pump tray 950 is inserted in the liquid pumping unit 900, the flanges 976a, 976b of the rail feet 973, 974 are positioned in an overlying relation to the rail floors 924. Laterally outward of each rail floor 924 and extending transversely upward from the corresponding rail floor is a rail flange 925. The outer edge of each rail-foot flange 976a, 976b is captured in slidable engagement with a gap 929 defined by the rail flange 925 relative to the rail floor 924, permitting the rail foot 973, 974 of the pump tray 950 to translate longitudinally within the liquid pumping unit 900 along rail 920 of the liquid pumping unit, but preventing the rail foot 973, 974 from moving transversely relative to the rail floor 924 (e.g., lifting away from the rail floor). As each rail foot 973, 974 is in fixed relation to the pump tray 950, the pump tray 950 also can translate longitudinally within the liquid pumping unit 900 but not transversely. Consequently, the blind-mate couplers 951, 953 of the inlet and the outlet of the pump tray 950 can translate along a corresponding longitudinal axis aligned with the counterpart blind-mate couplers 845, 910 of the reservoir 800 and internal piping. As noted above, to facilitate alignment of the rail foot 973, 974 with the guide rail 922 and rail flange 925, a leading segment of the outer edge of each rail-foot flange 976a, 976b can be inwardly tapered, easing installation of the pump tray 950 in the liquid pumping unit 900. Also shown in FIG. 31 is a coolant connection 930 (similar to coolant connection 608 in FIG. 7).

Figure 32:
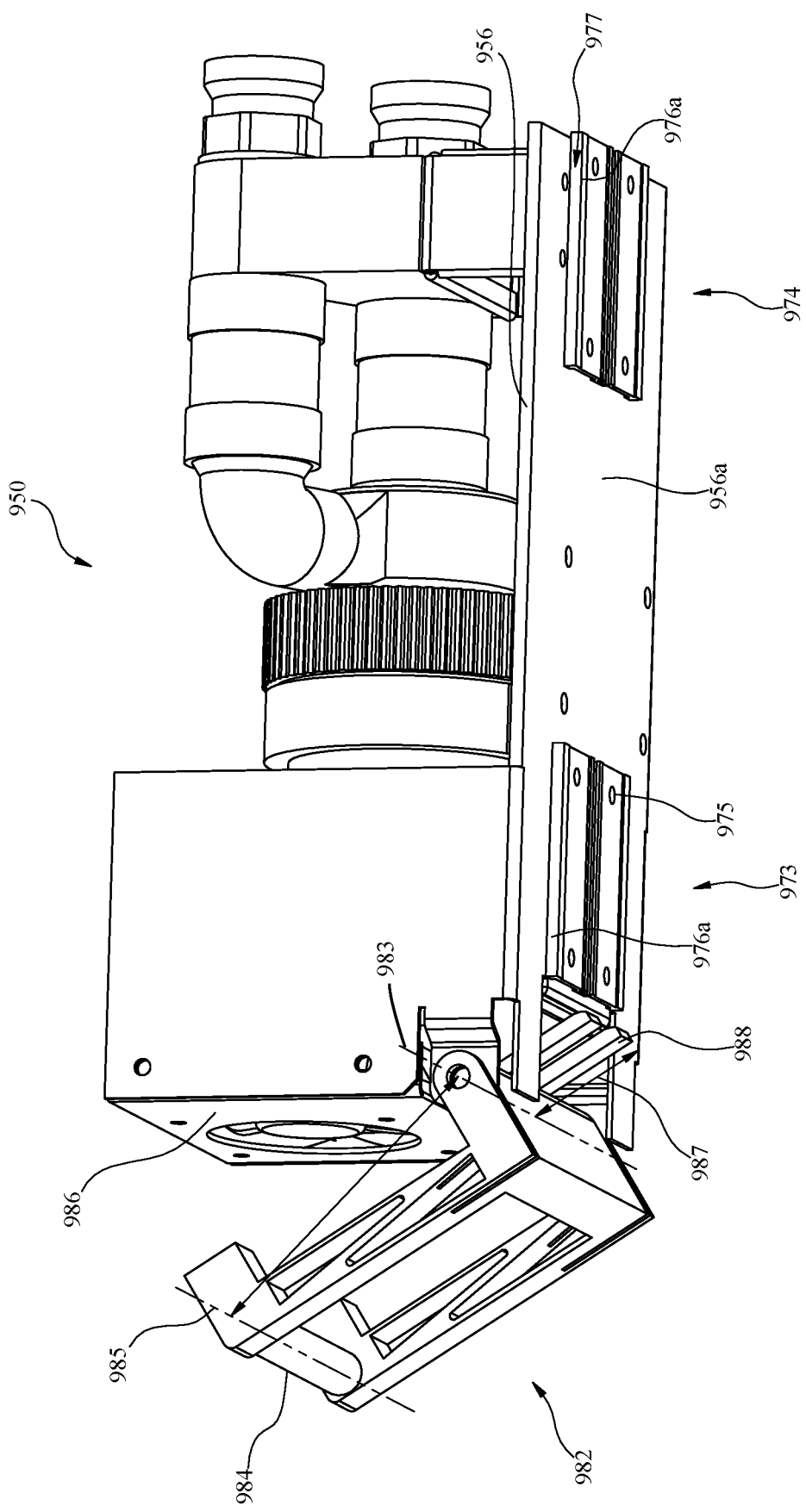
FIG. 32 shows an isometric view of the pump-tray removed from the liquid pumping unit in FIG. 31, with a cover removed to reveal internal features of the pump tray.
Figure 33:
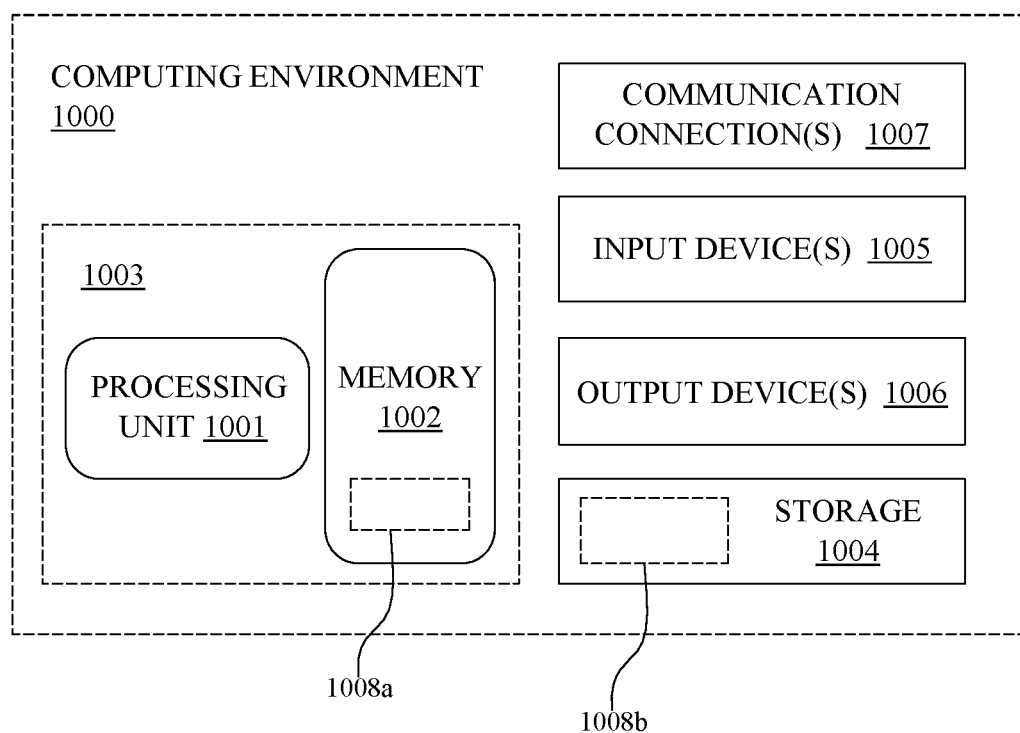
FIG. 33 illustrates a generalized example of a suitable computing environment for implementing one or more technologies described herein.

As shown in FIGS. 32 and 33, the liquid pumping unit 900 and the pump tray 950 also can define complementary features configured to seat the pump tray within the liquid pumping unit and inhibit an accidental or inadvertent removal or ejection of the pump tray from the liquid pumping unit. For example, the pump tray 950 can have a lockable lever device 980 configured to urge the pump tray inward relative to the liquid pumping unit 900, as to seat the blind-mate couplers 951, 953 of the pump tray 950 in each counterpart coupler 845, 910 of the liquid pumping unit. In FIG. 32, the pump tray 950 has an asymmetric lever 982 pivotably mounted to a front end. An axis 983 about which the lever 982 pivots is oriented in a transverse direction, e.g., an orthogonal direction, relative to a longitudinal axis of the pump tray 950 (e.g., in a direction orthogonal to the slots 975 in the rail feet 976a, 976b). The lever 982 defines a user-graspable handle 984 having an axis 985 generally parallel with the axis 983 of rotation (hinge axis) of the asymmetric lever 982. The handle 984 is supported by arms 986 extending transversely relative to the hinge axis 983 in a first direction.

The asymmetric lever 982 also defines one or more relatively shorter lever arms 987 extending transversely relative to the hinge axis 983. Each relatively shorter lever arm(s) 987 defines a corresponding toe 988 that can be inserted in a recessed region 926 of the rail floor of the liquid pumping unit rail 920 (FIG. 31). On insertion of the pump tray 950 in the liquid pumping unit bay 919, each toe 988 can urge against a bearing surface 927 defined by the recess 926 in the floor 924 of the rail 920 as the handle 984 of the asymmetric lever 982 urges toward the pump tray 950. Thus, as a user urges the pump tray 950 into the liquid pumping unit 900 by applying an inwardly directed force to the handle 984 of the asymmetric lever 982, the user-applied insertion force can be amplified in proportion to the ratio of the length of the handle's lever arm 986 to the length of the toe's lever arm 987.

The asymmetric lever 982, pump tray 950 and rail 920 of the reservoir-and-pump unit 900 can be so sized and configured that the handle 983 or another feature of the asymmetric lever 982 latches (e.g., in an "over-center" orientation) to a counterpart feature on the pump tray 950 or the liquid pumping unit 900, locking the pump tray 950 into position until the features are unlatched. Moreover, the latching mechanism or the asymmetric lever 982 (or both) can incorporate or cooperate with a limit switch 928.

The limit switch 928 can be incorporated in an electrical circuit that provides an input to a controller. For example, an opening (or a closing) of a limit switch 928 can open or close an electrical pathway, and the opened or closed state can indicate alternatively, that the pump tray 950 is properly inserted or improperly inserted. A controller can interpret the state indicated by the limit switch 928 as an input to activate or to deactivate the pump 960, or to cause a computing environment to issue an alert or to take other action.

For example, on de-latching of the handle 984 from its latched and closed position, a limit switch can close and convey a signal (e.g., an electrical current or voltage) to a controller. The controller can interpret the signal as an indication that the pump tray 950 is being removed. The controller can then interrupt power to the pump 960 in the pump tray 950 and/or close a valve to redirect coolant flowing through the liquid pumping unit 900 to flow through a different pump (e.g., a pump in another installed pump tray), or cause the cooling system to perform one or more other functions. For example, the controller can cause the other pump in the liquid pumping unit to increase its speed of rotation (and thus its flow rate and pressure head output) to compensate for the loss of the pump 960 in the pump tray 950 being removed. On latching of the handle 984 following insertion of a new pump tray 950 (or reinsertion of the removed pump tray), the limit switch 928 can open and interrupt the signal to the controller. The controller can interpret the interruption as an indication that a pump has been installed in the liquid pumping unit 900 and cause the cooling system to perform a corresponding act. For example, the controller can open a valve to permit a flow of coolant through the pump 960 and/or the controller can deliver power to the pump, causing the newly installed (or re-installed) pump to urge coolant through the liquid pumping unit 900. In concert with activating the installed/re-installed pump, the controller can slow the speed of rotation of the other pump in the liquid pumping unit in a manner complementary with the output of the installed/re-installed pump.

Referring again to FIG. 31, an internal limit switch 928 is shown. The internal limit switch 928 is positioned adjacent a rail 920 and can be actuated (e.g., opened or closed) as a pump tray 950 is inserted into or retracted from the reservoir 800 in the liquid pumping unit 900. For example, when inserting a pump tray 950, the limit switch 928 can be actuated before the blind-mate couplers contact and urge against each other, providing means for notifying a control logic that a new pump tray is being inserted. The control logic can, in response to actuation of the limit switch, change a state of operation for the liquid pumping unit 900. For example, the control logic can cause a pump 960 in an adjacent pump tray 950 to slow for a selected duration of time. Such slowing of the adjacent pump can reduce an operating pressure within the liquid pumping unit 900 and facilitate mating of the blind-mate couplers by reducing forces from the internal pressure that need to be overcome to seat the blind-mate couplers.

Although connection and disconnection of blind-mate fluid couplers is described above in some detail, it should be understood that the pump tray and the corresponding liquid pumping unit can also include correspondingly configured blind-mate electrical connectors to facilitate connecting and disconnecting electrical circuits as the pump tray is inserted and withdrawn from the liquid pumping unit. Such electrical circuits can contain, among other features, any of a variety of sensors and controllers, as for observing fan or pump speed and communicating such information to or receiving information from control logic.

IV. Computing Environments

FIG. 33 illustrates a generalized example of a suitable computing environment 1000 in which described methods, embodiments, techniques, and technologies relating, for example, to control of a filling operation and other system control for a liquid-filled closed loop system. The computing environment 1000 is not intended to suggest any limitation as to scope of use or functionality of the technologies disclosed herein, as each technology may be implemented in diverse general-purpose or special-purpose computing environments. For example, each disclosed technology may be implemented with other computer system configurations, including wearable and handheld devices, multiprocessor systems, microprocessor-based or programmable consumer electronics, embedded platforms, network computers, mini-computers, mainframe computers, smartphones, tablet computers, data centers, audio devices, and the like. Each disclosed technology may also be practiced in distributed computing environments where tasks are performed by remote processing devices that are linked through a communications connection or network. In a distributed computing environment, program modules may be located in both local and remote memory storage devices.

The computing environment 1000 includes at least one central processing unit 1010 and memory 1002. In FIG. 33, this most basic configuration 1003 is included within a dashed line and may represent the control logic, e.g., control logic 1040. The central processing unit 1010 executes computer-executable instructions and may be a real or a virtual processor. In a multi-processing system, multiple processing units execute computer-executable instructions to increase processing power and as such, multiple processors can run simultaneously. The memory 1002 may be volatile memory (e.g., registers, cache, RAM), non-volatile memory (e.g., ROM, EEPROM, flash memory, etc.), or some combination of the two. The memory 1002 stores software 1008a that can, for example, implement one or more of the innovative technologies described herein, when executed by a processor.

A computing environment may have additional features. For example, the computing environment 1000 may include storage 1004, one or more input devices 1005, one or more output devices 1006, and one or more communication connections 1007. An interconnection mechanism (not shown) such as a bus, a controller, or a network, interconnects the components of the computing environment 1000. Typically, operating system software (not shown) provides an operating environment for other software executing in the computing environment 1000, and coordinates activities of the components of the computing environment 1000.

The store 1004 may be removable or non-removable, and can include selected forms of machine-readable media. In general, machine-readable media include magnetic disks, magnetic tapes or cassettes, non-volatile solid-state memory, CD-ROMs, CD-RWs, DVDs, magnetic tape, optical data storage devices, and carrier waves, or any other machine-readable medium which can be used to store information, and that can be accessed within the computing environment 1000. The storage 1004 stores instructions for the software 1008b, which can implement technologies described herein.

The storage 1004 can also be distributed over a network so that software instructions are stored and executed in a distributed fashion. In other embodiments, some of these operations might be performed by specific hardware components that contain hardwired logic. Those operations might alternatively be performed by any combination of programmed data processing components and fixed hardwired circuit components.

The input device(s) 1005 may be a touch input device, such as a keyboard, keypad, mouse, pen, touchscreen, touch pad, or trackball, a voice input device, a scanning device, or another device, that provides input to the computing environment 1000.

The output device(s) 1006 may be a display, printer, speaker transducer, DVD-writer, or another device that provides output from the computing environment 1000.

The communication connection(s) 1007 enable communication over a communication medium (e.g., a connecting network) to another computing entity. The communication medium conveys information such as computer-executable instructions, compressed graphics information, processed signal information (including processed audio signals), or other data in a modulated data signal.

Thus, disclosed computing environments are suitable for performing disclosed orientation estimation and audio rendering processes as disclosed herein.

Machine-readable media are any available media that can be accessed within a computing environment 1000. By way of example, and not limitation, with the computing environment 1000, machine-readable media include memory 1002, storage 1004, communication media (not shown), and combinations of any of the above. Tangible machine-readable (or computer-readable) media exclude transitory signals.

As explained above, some disclosed principles can be embodied in a tangible, non-transitory machine-readable medium (such as microelectronic memory) having stored thereon instructions, which program one or more data processing components (generically referred to here as a "processor") to perform the digital signal processing operations of the control logic described above including estimating, adapting, computing, calculating, measuring, adjusting, sensing, measuring, filtering, addition, subtraction, inversion, comparisons, and decision making. In other embodiments, some of these operations (of a machine process) might be performed by specific electronic hardware components that contain hardwired logic (e.g., dedicated digital filter blocks). Those operations might alternatively be performed by any combination of programmed data processing components and fixed hardwired circuit components.

V. Other Exemplary Embodiments

Directions and references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, each piece of patent and non-patent literature cited herein is hereby incorporated by reference in its entirety for all purposes.

The principles described above in connection with any particular example can be combined with the principles described in connection with any one or more of the other examples. Accordingly, this detailed description shall not be construed in a limiting sense, and following a review of this disclosure, those of ordinary skill in the art will appreciate the wide variety of cooling systems, controllers and methods that can be devised using the various concepts described herein. Moreover, those of ordinary skill in the art will appreciate that the exemplary embodiments disclosed herein can be adapted to various configurations without departing from the disclosed principles.

For example, a disclosed system can include an enclosure having an inlet to the enclosure and a wall at least partially defining a boundary of the enclosure. The enclosure can be configured to receive a liquid from the inlet and to contain the received liquid. An aperture can extend through the wall. A conduit can be coupled with the aperture, and the conduit can include a segment extending into the enclosure from the aperture. A baffle can define a corresponding plurality of apertures. The baffle can be positioned between the inlet and the segment of the conduit, and the baffle can be oriented such that liquid received from the inlet passes through the plurality of apertures in the baffle before entering the segment of conduit.

Each in the plurality of apertures in the baffle can be circular or polygonal.

The baffle can include one or more of a screen, a mesh, and an expanded-metal panel.

The baffle can be oriented transversely relative to the wall. For example, the baffle can be oriented orthogonally of a flow direction between the inlet and the segment of conduit. The baffle can be so oriented relative to a bulk flow direction between the inlet and the segment of conduit as to turn a direction of flow adjacent the baffle. In some embodiments, the baffle is curved, and in others the baffle is substantially planar.

The baffle can extend from a height above a maximum liquid level of the reservoir toward the bottom of the reservoir without contacting the bottom of the reservoir.

The system can also include a pump and conduit fluidly coupling the pump with the aperture in the wall. The aperture in the wall can be a first aperture, and the inlet can be a second aperture in the wall.

Other system arrangements are possible. For example, a system can include a sealed reservoir having a top, a bottom, and a side wall. The reservoir can be configured to receive a liquid from an inlet and to hold the liquid. A wall aperture can extend through the side wall. A liquid conduit can be coupled with the wall aperture at a first conduit aperture. The liquid conduit can define a second conduit aperture inside the reservoir. The liquid conduit can also include bend, such that a first distance from the bottom of the reservoir to the second conduit aperture is smaller than a second distance from the bottom of the reservoir to a bottom edge of the wall aperture.

A plane of the second conduit aperture can be parallel to the bottom of the reservoir. The liquid conduit can be perpendicular to the side wall at the wall aperture.

A baffle can have a plurality of apertures. Each aperture can have a hydraulic diameter. The baffle can be positioned between the inlet and the second conduit aperture and the baffle can be oriented so that the liquid received from the inlet passes through the plurality of apertures in the baffle before exiting the reservoir at the second conduit aperture.

A control system can include control logic comprising a processing unit and instructions stored on a memory that, when executed by the processing unit, cause the control logic to perform selected actions. Such actions can be combined. For example, the control logic can communicate a control signal to a pump in a liquid pumping unit. The control logic can receive a signal from a sensor in the liquid pumping unit. The control logic can iteratively activate and deactivate the pump via the control signal until the signal received from the sensor comprises an indication that the liquid pumping unit is filled with a liquid to a specified amount.

The control logic can activate the pump for a duration of less than one minute, or about 1-3 minutes. The signal from the sensor can include a value of an observational parameter. The control logic can compare the value of the observational parameter to a programmed value to determine whether the signal comprises the indication.

The operational parameter can be at least one of: a temperature, a pressure, a flow rate, a pump speed, a mass, a fluid level, a fluid volume, a load on a pump, a specific volume, an enthalpy, a specific heat, and a combination thereof.

The control logic can calculate a value as a function of the value of the observational parameter to determine whether the signal comprises the indication.

The control logic can communicate a second control signal to a valve in the liquid pumping unit. The valve can be configured to release gas from the liquid pumping unit.

The control logic can open the valve via the second control signal responsive to the signal received from the sensor.

A system can include a reservoir defining an inlet and an outlet, and the reservoir can be configured to hold a liquid received from the inlet. The pump can have a pump outlet and a pump inlet, where the pump inlet is fluidically coupled to the reservoir outlet by a first liquid conduit. The pump can be configured to pump the liquid from the reservoir through the pump outlet to a second liquid conduit.

A fill reservoir can be configured to fluidically couple to the inlet of the reservoir; and a second pump can be configured to pump liquid from the fill reservoir to the reservoir.

The control signal to the pump can be a first control signal to the first pump, and the control logic can communicate a second control signal to the second pump.

The second liquid conduit can be fluidically coupled to a closed-loop liquid operational block.

The pump can be a first pump, and the system can further include at least one other pump having a corresponding pump inlet fluidically coupled to the reservoir and a pump outlet. Each of the pumps can be configured to pump the liquid from the reservoir through the corresponding pump outlet to a different liquid conduit.

The control logic can be configured to iteratively activate and deactivate each of the plurality of pumps.

The control logic can be configured to iteratively activate and deactivate each of the plurality of pumps sequentially.

The control logic is configured to iteratively activate and deactivate each of the plurality of pumps in concurrently or jointly.

A rack-mountable server system can include a manifold module having a distribution manifold and a collection manifold, with each manifold being configured to contain a liquid. A rack can be configured to receive a plurality of independently operable servers and can include a branch of a heat-transfer system configured to convey the liquid from an inlet to the branch to an outlet from the branch. The inlet can be fluidly couplable with the distribution manifold and the outlet can be fluidly couplable with the collection manifold. The branch can correspond with a first server of the plurality of servers, and each other server can have a corresponding branch of the heat-transfer system having an inlet fluidly coupled to the distribution manifold and an outlet fluidly coupled to the collection manifold. The rack-mountable server system can also include a liquid pumping unit. The liquid pumping unit can include a reservoir configured to receive the liquid via an inlet fluidically couplable to the collection manifold and to hold the liquid. A heat exchange component can be fluidically couplable to the distribution manifold. A pump can be coupled to the reservoir with a first liquid conduit, and the pump can be configured to pump the liquid from the reservoir to the heat exchange component. A sensor can be configured to observe an operational parameter in the system. The system can also include control logic configured to communicate a control signal to the pump; receive a signal from the sensor; and iteratively activate and deactivate the pump via the control signal until the signal received from the sensor comprises an indication that the liquid pumping unit is filled with a liquid to a specified amount.

The control logic can also be configured to iteratively activate and deactivate the pump via the control signal until the signal received from the sensor comprises an indication that the manifold module is filled with the liquid to a specified amount.

The control logic can be configured to iteratively activate and deactivate the pump via the control signal until the signal received from the sensor comprises an indication that the branches of the heat-transfer system are filled with the liquid to a specified amount.

The previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, this detailed description shall be construed in a limiting sense, and following a review of this disclosure, those of ordinary skill in the art will appreciate the wide variety of reservoir and pump units, and related methods and systems, that can be devised using disclosed and claimed concepts.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

This description is not intended to be limited to the embodiments shown herein, but is to be accorded the full scope consistent with the language of the description, wherein reference to a feature in the singular, such as by use of the article "a" or "an" is not intended to mean "one and only one" unless specifically so stated, but rather "one or more".

Thus, in view of the many possible embodiments to which the disclosed principles can be applied, we reserve the right to claim any and all combinations of features and acts described herein, including the right to claim all that comes within the scope and spirit of the foregoing description, as well as all combinations of identified features, whether such combination is expressly or implicitly recited in or among the following claims.

We currently claim:

1. A pump tray, comprising:
a liquid pump having an inlet and an outlet;
a first blindly matable liquid coupler fluidicly coupled with the pump inlet and a second blindly matable liquid coupler fluidicly coupled with the pump outlet;
a chassis having an alignment member configured to removably engage with an alignment member of a liquid-pumping unit and to restrict, to a limited number of degrees-of-freedom, movement of the chassis relative to the liquid-pumping unit, wherein the first blindly matable liquid coupler and the second blindly matable liquid coupler are so physically coupled with the chassis as to inhibit movement of the first blindly matable liquid coupler and the second blindly matable liquid coupler relative to the chassis.

2. The pump tray according to claim 1, further comprising an insertion lever configured to engage a complementary feature defined by the liquid-pumping unit and, on actuation in a first direction, to urge one or both of the first blindly matable liquid coupler and the second blindly matable liquid coupler to mate with a complementarily configured liquid coupler of the liquid-pumping unit.

3. The pump tray according to claim 2, wherein the insertion lever is further configured to latch in closed position and maintain a mated connection of one or both of the first blindly matable liquid coupler and the second blindly matable liquid coupler with the complementarily configured liquid coupler of the liquid-pumping unit.

4. The pump tray according to claim 3, further comprising a limit switch, wherein the limit switch is configured to be actuated by movement of the insertion lever, movement of the chassis, or both.

5. The pump tray according to claim 1, further comprising at least one blindly matable electrical connector configured to matingly engage or to matingly disengage from a complementary electrical connector in correspondence with insertion or removal of the chassis from the liquid-pumping unit.

6. The pump tray according to claim 1, wherein the liquid-pumping unit other device comprises a reservoir, wherein the first blindly matable liquid coupler is configured to matingly engage a corresponding matable liquid coupler fluidicly coupled with the reservoir.

7. The pump tray according to claim 1, wherein the alignment member defines a slot configured to slidably receive a correspondingly configured rail defined by the liquid-pumping unit.

8. The pump tray according to claim 1, wherein the alignment member defines a flange configured to slidably engage corresponding structure defined by the liquid-pumping unit.

9. A liquid pumping unit, comprising:
a chassis defining a bay configured to receive a pump tray;
a liquid inlet coupler and a liquid outlet coupler;
a reservoir having a reservoir inlet and a reservoir outlet, wherein the reservoir inlet is fluidicly coupled with the liquid inlet coupler;
a first blindly-matable liquid coupler fluidicly coupled with the reservoir outlet;
a second blindly-matable liquid coupler fluidicly coupled with the liquid outlet coupler; and
an alignment member configured to removably engage with the pump tray and to restrict, to a limited number of degrees-of-freedom, movement of the pump tray relative to the chassis, wherein the first blindly matable liquid coupler and the second blindly matable liquid coupler are so physically coupled with the chassis as to inhibit movement of the first blindly matable liquid coupler and the second blindly matable liquid coupler relative to the chassis; wherein each of the first blindly matable liquid coupler and the second blindly matable liquid coupler is configured to fluidicly couple with a corresponding blindly matable liquid coupler associated with the pump tray when the pump tray is inserted in the bay defined by the chassis.

10. The liquid pumping unit according to claim 9, wherein the chassis is configured to removably retain the pump tray in a stationary position when the pump tray is inserted in the bay defined by the chassis.

11. The liquid pumping unit according to claim 10, wherein each of the first blindly matable liquid coupler and the second blindly matable liquid coupler is further configured to fluidicly decouple from the corresponding blindly matable liquid coupler associated with the pump tray when the pump tray is displaced from the stationary position.

12. A liquid pumping unit comprising:
a chassis defining a bay configured to receive a pump tray;
a liquid inlet coupler and a liquid outlet coupler;
a reservoir having a reservoir inlet and a reservoir outlet, wherein the reservoir inlet is fluidicly coupled with the liquid inlet coupler;
a first blindly-matable liquid coupler fluidicly coupled with the reservoir outlet;
a second blindly-matable liquid coupler fluidicly coupled with the liquid outlet coupler;
an alignment member configured to removably engage with the pump tray and to restrict, to a limited number of degrees-of-freedom, movement of the pump tray relative to the chassis, wherein the first blindly matable liquid coupler and the second blindly matable liquid coupler are so physically coupled with the chassis as to inhibit movement of the first blindly matable liquid coupler and the second blindly matable liquid coupler relative to the chassis; and
a limit switch configured to be actuated by insertion or removal of the pump tray relative to the bay defined by the chassis.

13. A liquid pumping unit comprising:
a chassis defining a bay configured to receive a pump tray;
a liquid inlet coupler and a liquid outlet coupler;

a reservoir having a reservoir inlet and a reservoir outlet, wherein the reservoir inlet is fluidicly coupled with the liquid inlet coupler;
a first blindly-matable liquid coupler fluidicly coupled with the reservoir outlet;
a second blindly-matable liquid coupler fluidicly coupled with the liquid outlet coupler;
an alignment member configured to removably engage with the pump tray and to restrict, to a limited number of degrees-of-freedom, movement of the pump tray relative to the chassis, wherein the first blindly matable liquid coupler and the second blindly matable liquid coupler are so physically coupled with the chassis as to inhibit movement of the first blindly matable liquid coupler and the second blindly matable liquid coupler relative to the chassis; and
at least one blindly matable electrical connector configured to matingly engage or to matingly disengage from a complementary electrical connector associated with the pump tray on insertion or removal, respectively, of the pump tray.

14. A liquid pumping unit comprising:
a chassis defining a bay configured to receive a pump tray;
a liquid inlet coupler and a liquid outlet coupler;
a reservoir having a reservoir inlet and a reservoir outlet, wherein the reservoir inlet is fluidicly coupled with the liquid inlet coupler;
a first blindly-matable liquid coupler fluidicly coupled with the reservoir outlet;
a second blindly-matable liquid coupler fluidicly coupled with the liquid outlet coupler; and
an alignment member configured to removably engage with the pump tray and to restrict, to a limited number of degrees-of-freedom, movement of the pump tray relative to the chassis, wherein the first blindly matable liquid coupler and the second blindly matable liquid coupler are so physically coupled with the chassis as to inhibit movement of the first blindly matable liquid coupler and the second blindly matable liquid coupler relative to the chassis, wherein the alignment member defines a rail flange configured to slidably engage a correspondingly configured flange defined by the pump tray.

15. A liquid pumping unit comprising:
a chassis defining a bay configured to receive a pump tray;
a liquid inlet coupler and a liquid outlet coupler;
a reservoir having a reservoir inlet and a reservoir outlet, wherein the reservoir inlet is fluidicly coupled with the liquid inlet coupler;
a first blindly-matable liquid coupler fluidicly coupled with the reservoir outlet;
a second blindly-matable liquid coupler fluidicly coupled with the liquid outlet coupler; and
an alignment member configured to removably engage with the pump tray and to restrict, to a limited number of degrees-of-freedom, movement of the pump tray relative to the chassis, wherein the first blindly matable liquid coupler and the second blindly matable liquid coupler are so physically coupled with the chassis as to inhibit movement of the first blindly matable liquid coupler and the second blindly matable liquid coupler relative to the chassis, wherein the alignment member defines a guide rail configured to slidably engage a corresponding slot defined by the pump tray.

16. A liquid pumping unit comprising:
a chassis defining a bay configured to receive a pump tray;
a liquid inlet coupler and a liquid outlet coupler;
a reservoir having a reservoir inlet and a reservoir outlet, wherein the reservoir inlet is fluidicly coupled with the liquid inlet coupler;
a first blindly-matable liquid coupler fluidicly coupled with the reservoir outlet;
a second blindly-matable liquid coupler fluidicly coupled with the liquid outlet coupler; and
an alignment member configured to removably engage with the pump tray and to restrict, to a limited number of degrees-of-freedom, movement of the pump tray relative to the chassis, wherein the first blindly matable liquid coupler and the second blindly matable liquid coupler are so physically coupled with the chassis as to inhibit movement of the first blindly matable liquid coupler and the second blindly matable liquid coupler relative to the chassis; and
a removable pump tray, wherein the removable pump tray comprises:
a liquid pump having an inlet and an outlet;
a third blindly matable liquid coupler fluidicly coupled with the pump inlet and configured to removably couple with the first blindly-matable liquid coupler and thereby to couple the reservoir outlet with the pump inlet; and
a fourth blindly matable liquid coupler fluidicly coupled with the pump outlet and configured to removably couple with the second blindly-matable liquid coupler and thereby to couple the pump outlet with the liquid outlet coupler.

17. The liquid pumping unit according to claim 16, wherein the removable pump tray further comprises an insertion lever configured to engage a complementary feature defined by the chassis and, on actuation in a first direction, to urge the pump tray into the bay.

18. The liquid pumping unit according to claim 17, wherein the insertion lever is further configured to latch in closed position and maintain a first mated connection of the first blindly matable liquid coupler with the third blindly matable liquid coupler and a second mated connection of the second blindly matable liquid coupler with the fourth blindly matable liquid coupler.

19. The liquid pumping unit according to claim 18, wherein the pump tray is configured to urge outward of the bay and decouple the first mated connection, the second mated connection, or both, when the insertion lever is released from the closed position.

* * * * *